(12) United States Patent
Yamada

(10) Patent No.: US 8,189,385 B2
(45) Date of Patent: May 29, 2012

(54) NONVOLATILE SEMICONDUCTOR MEMORY DEVICE, METHOD FOR MANUFACTURING THE SAME, AND NONVOLATILE MEMORY ARRAY

(75) Inventor: Kouichi Yamada, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 643 days.

(21) Appl. No.: 12/341,209

(22) Filed: Dec. 22, 2008

(65) Prior Publication Data

US 2009/0168529 A1 Jul. 2, 2009

(30) Foreign Application Priority Data

| Dec. 26, 2007 | (JP) | 2007-333612 |
| Feb. 15, 2008 | (JP) | 2008-035119 |
| Feb. 15, 2008 | (JP) | 2008-035120 |
| Jun. 25, 2008 | (JP) | 2008-166507 |

(51) Int. Cl.
*G11C 11/34* (2006.01)
(52) U.S. Cl. ......... 365/185.05; 365/185.18; 365/185.29; 365/185.14
(58) Field of Classification Search ............. 365/185.05, 365/185.18, 185.29, 185.14
See application file for complete search history.

(56) References Cited

U.S. PATENT DOCUMENTS

| 7,130,216 | B2* | 10/2006 | Bhattacharyya | 365/185.08 |
| 7,286,401 | B2 | 10/2007 | Ishimaru et al. | |
| 2005/0253183 | A1* | 11/2005 | Umezawa et al. | 257/315 |
| 2006/0050557 | A1* | 3/2006 | Ishimaru et al. | 365/185.05 |

FOREIGN PATENT DOCUMENTS

| CN | 1124409 | 6/1996 |
| CN | 1629983 A | 6/2005 |
| JP | 07-249701 | 9/1995 |

OTHER PUBLICATIONS

Chinese Office Action, w/ English translation thereof, issued in Chinese Patent Application No. 200810185251.6, dated Aug. 25, 2011.
Chinese Office Action, with English translation, issued in Chinese Patent Application No. 200810185251.6, mailed Jun. 3, 2010.

* cited by examiner

*Primary Examiner* — Son Dinh
(74) *Attorney, Agent, or Firm* — McDermott Will & Emery LLP

(57) ABSTRACT

A floating gate made of polysilicon is provided on a semiconductor substrate through the medium of a gate insulator. A side-wall insulating film is provided on each side wall of the floating gate. A first impurity diffusion layer, which occupies a space within the semiconductor substrate, is provided separately apart from the floating gate by a predetermined distance. A second impurity diffusion layer, which occupies a space within the semiconductor substrate, overlaps with the floating gate. Electrons are injected into the floating gate by applying a high voltage to the second impurity diffusion layer in capacitive coupling with the floating gate.

19 Claims, 26 Drawing Sheets

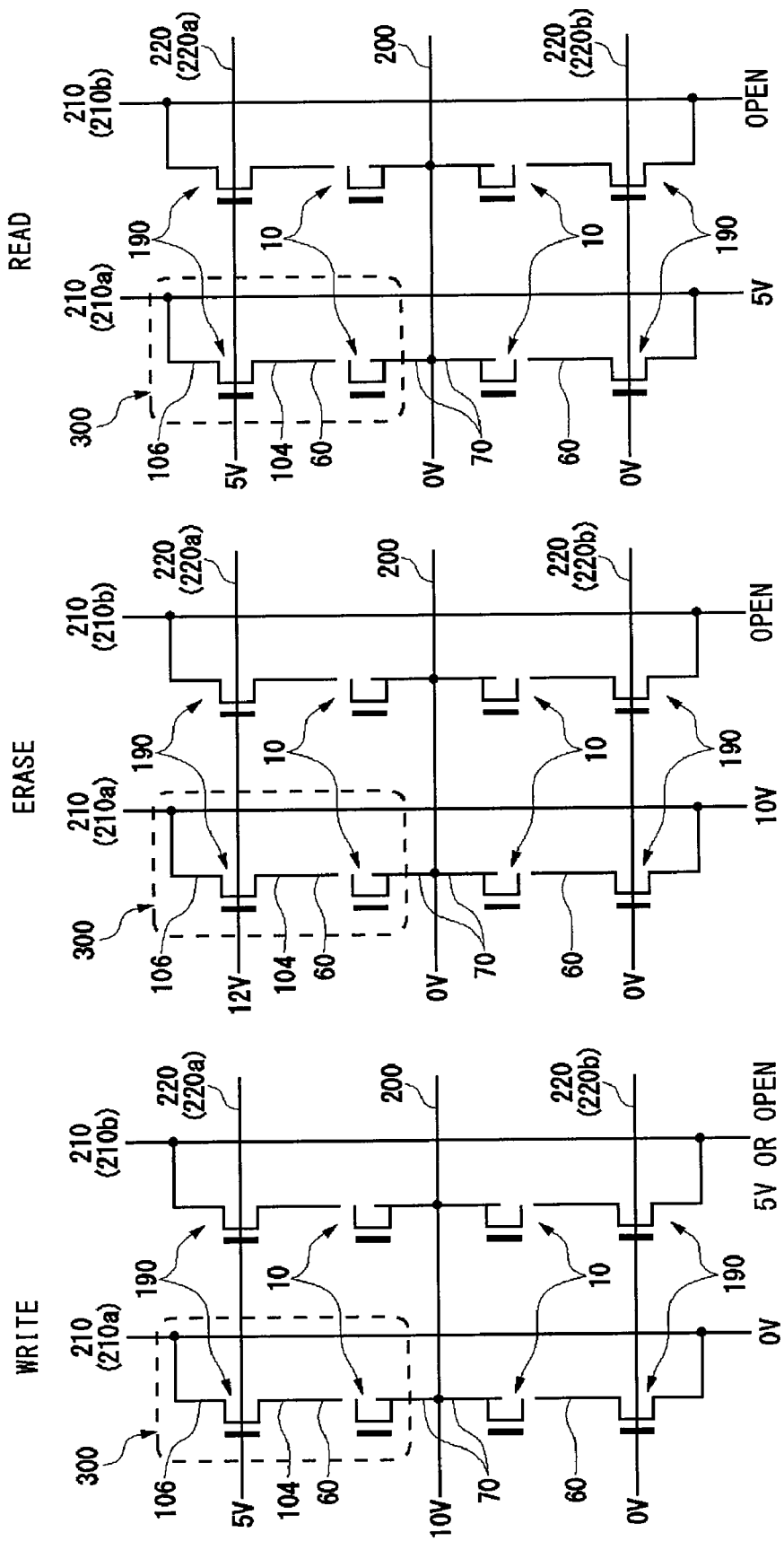

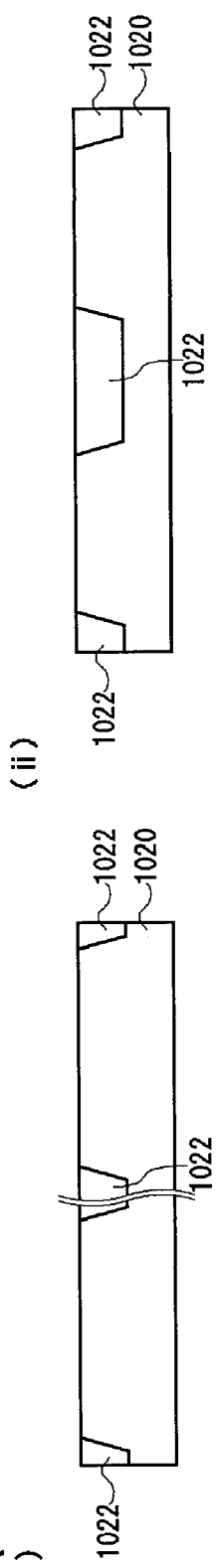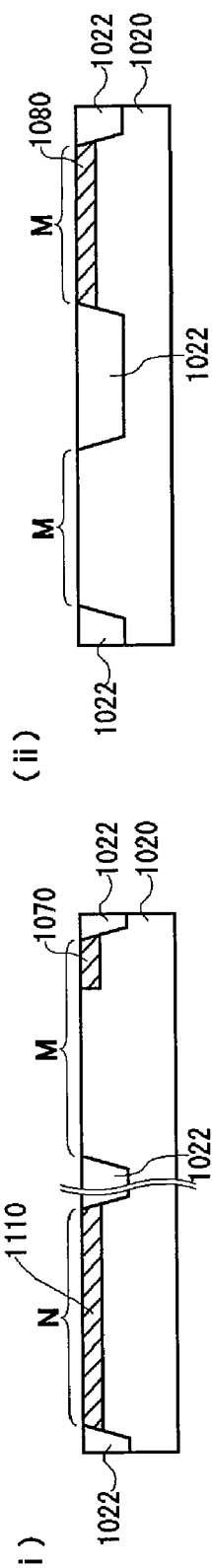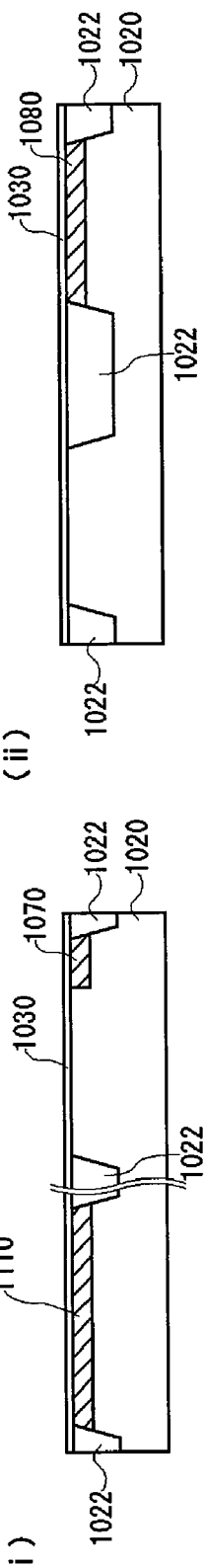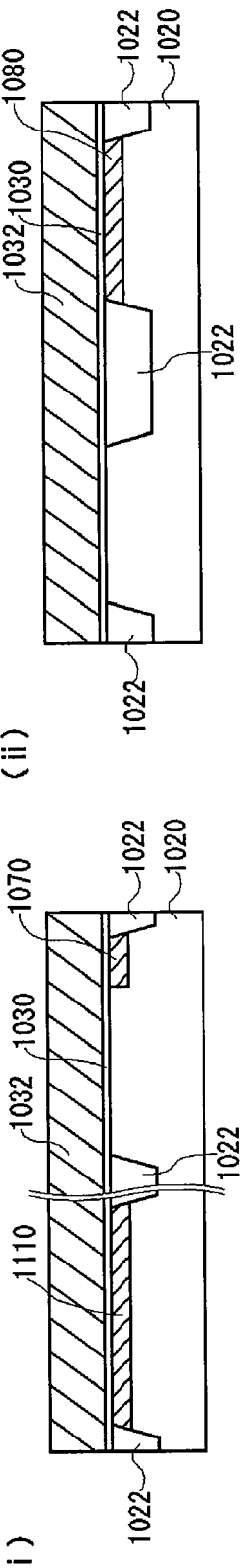

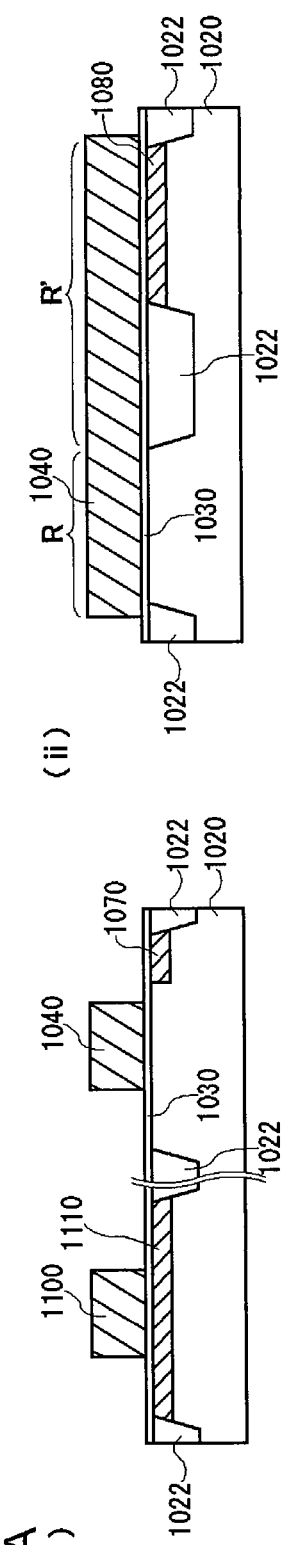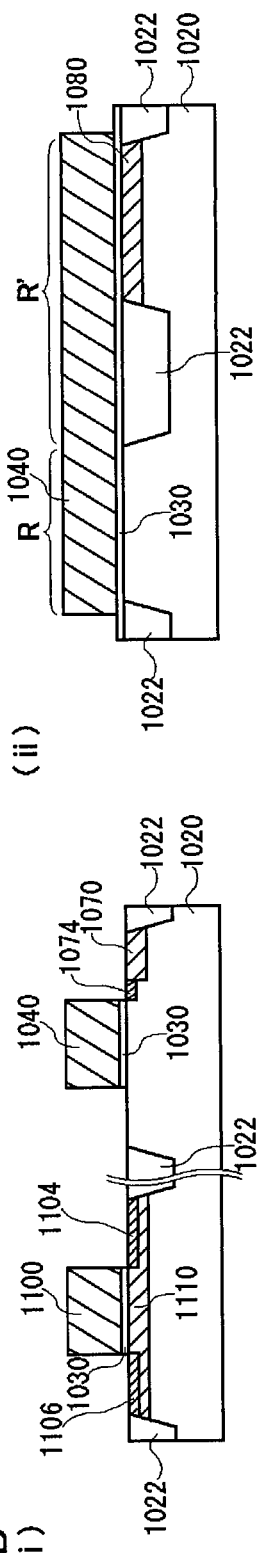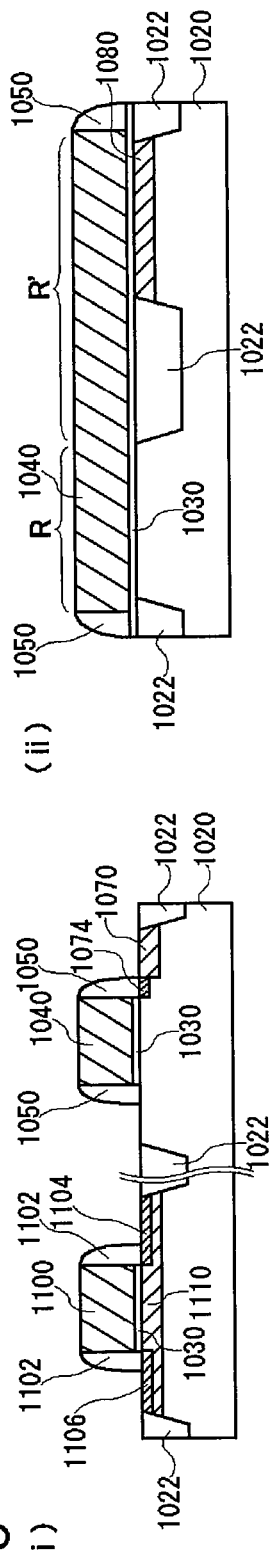

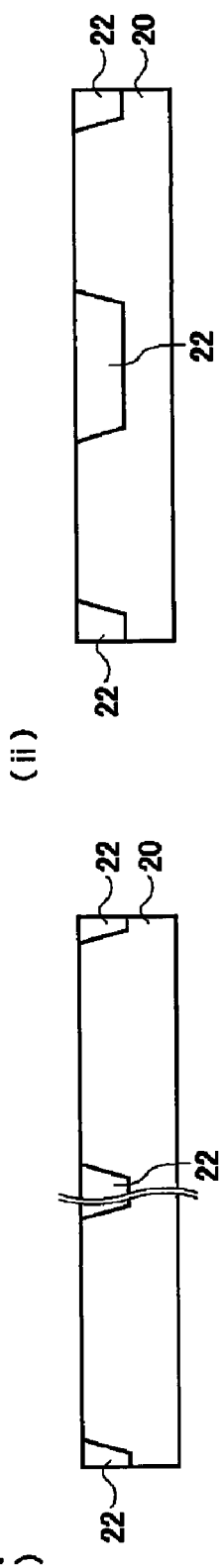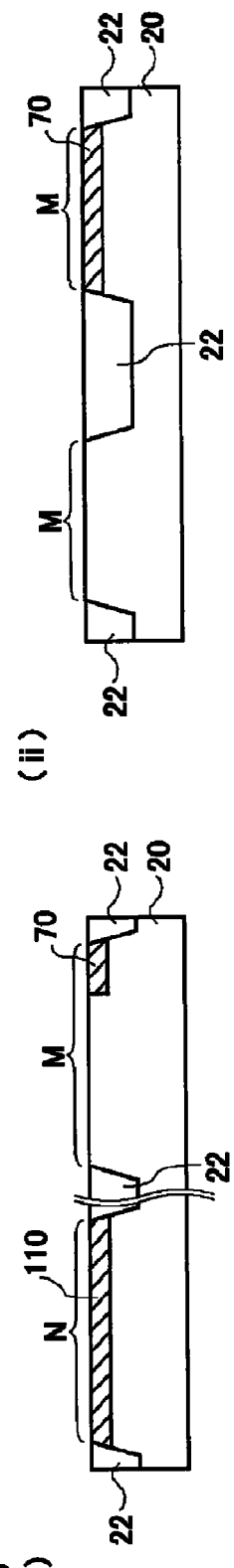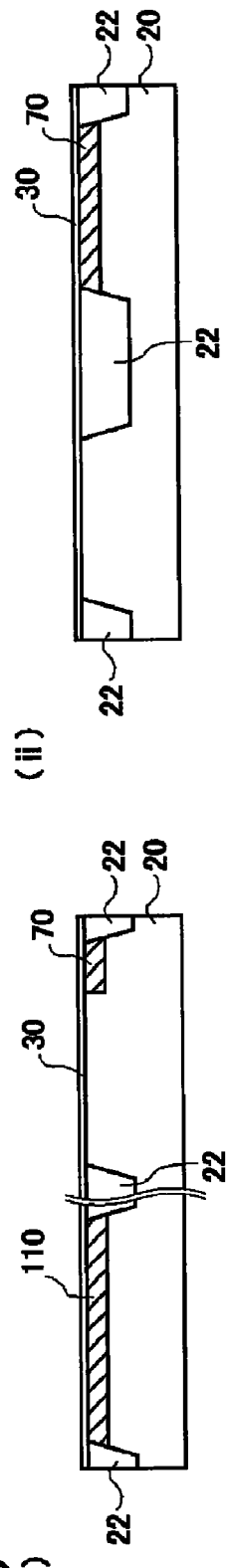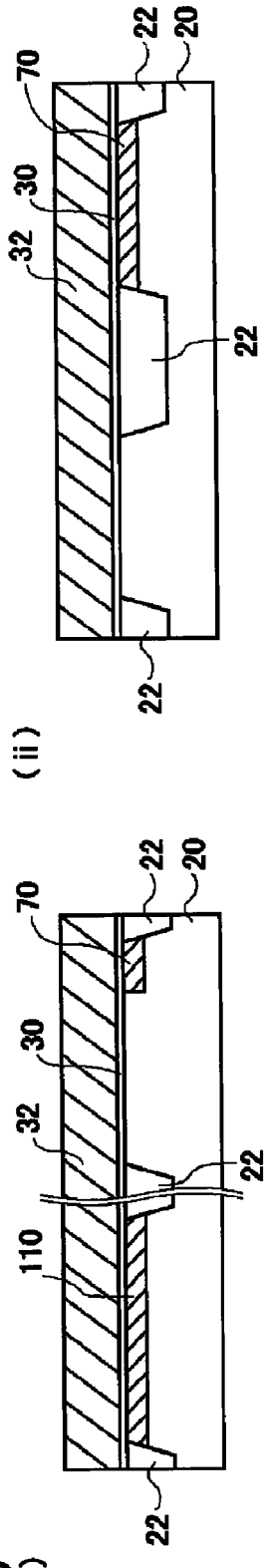

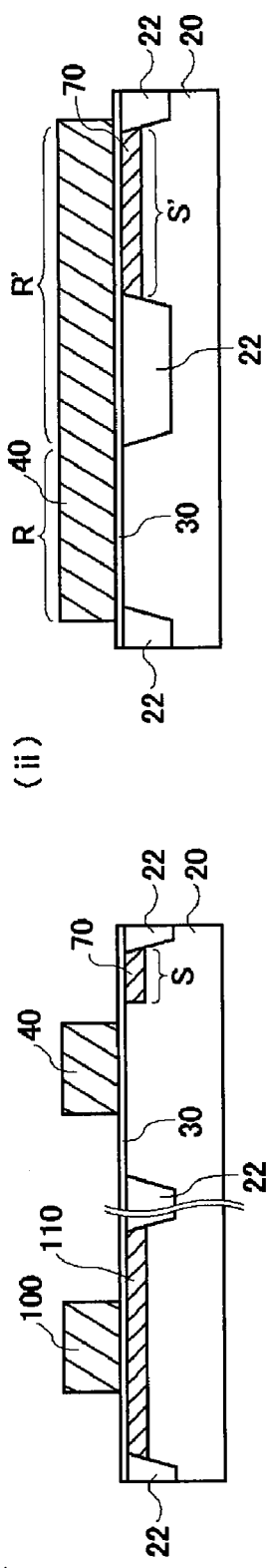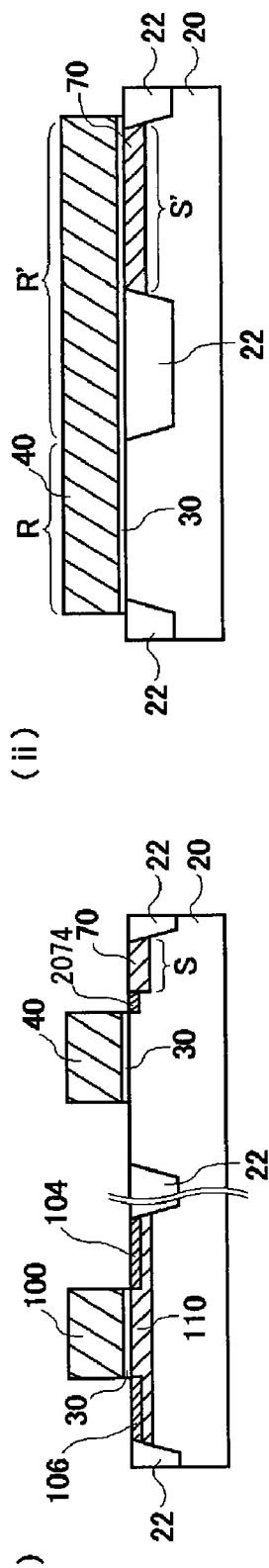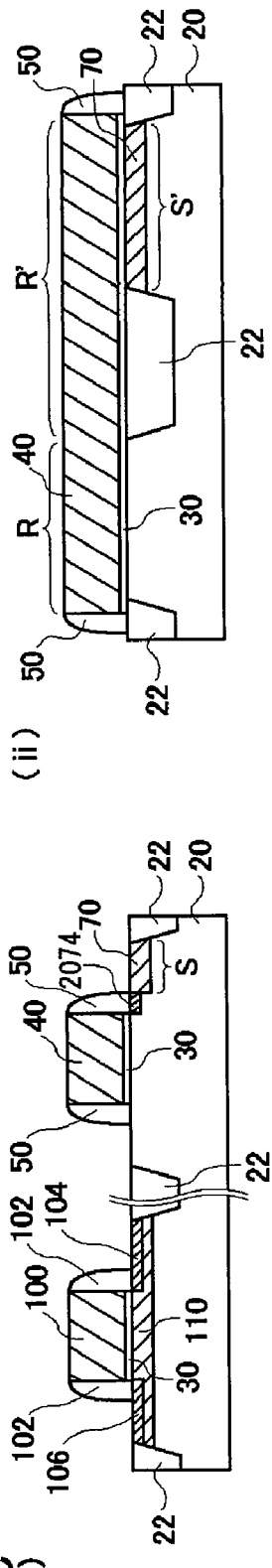

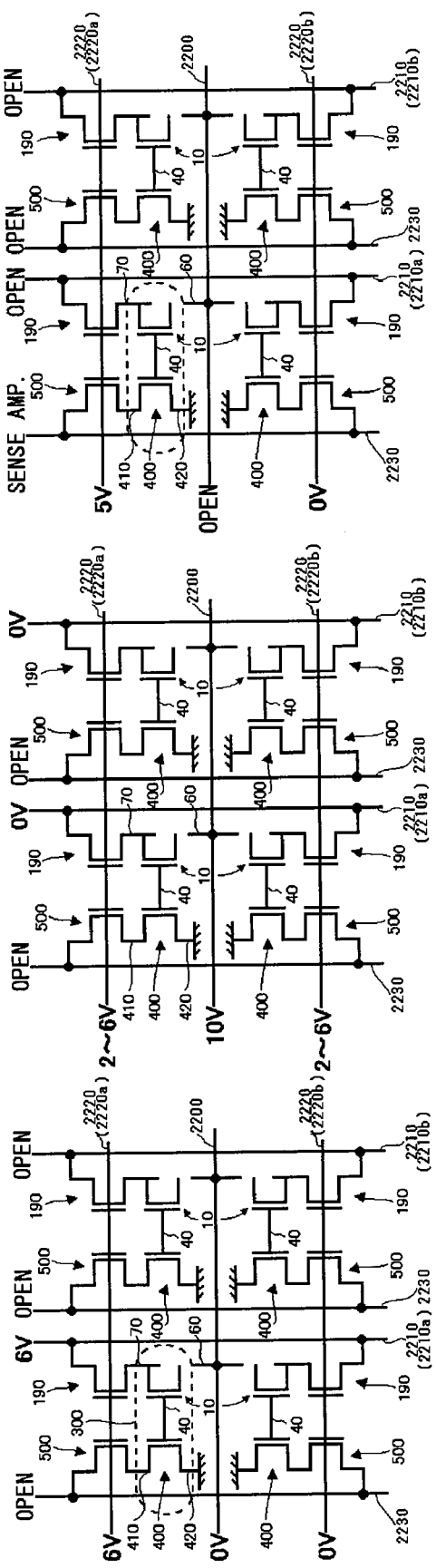

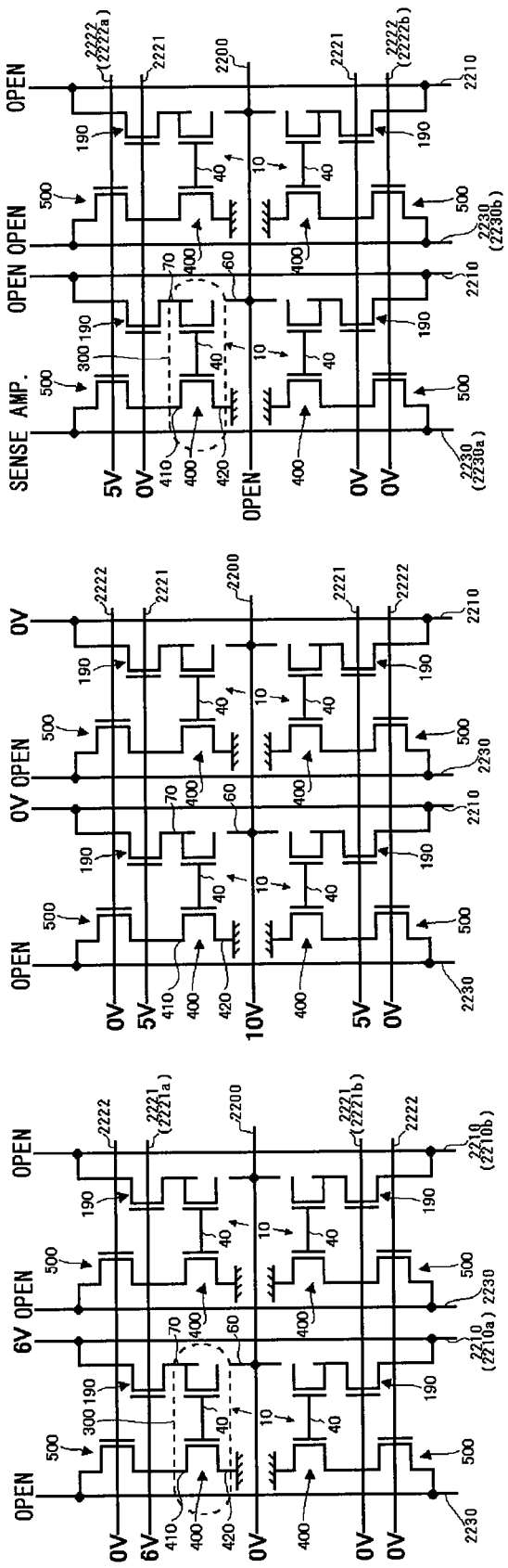

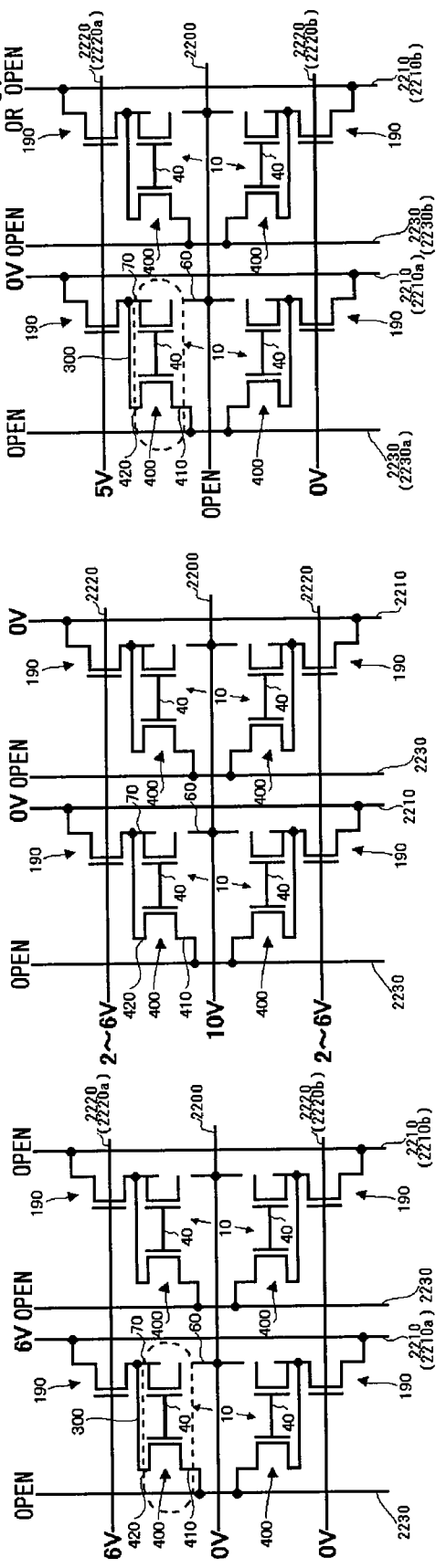

NONVOLATILE SEMICONDUCTOR MEMORY DEVICE, METHOD FOR MANUFACTURING THE SAME, AND NONVOLATILE MEMORY ARRAY

CROSS-REFERENCE TO RELATED APPLICATIONS

This application is based upon and claims the benefit of priority from the prior Japanese Patent Application No. 2007-333612, filed Dec. 26, 2007, Japanese Patent Application No. 2008-035119, filed Feb. 15, 2008, Japanese Patent Application No. 2008-166507, filed Jun. 25, 2008, and Japanese Patent Application No. 2008-035120, filed Feb. 15, 2008, the entire contents of which are incorporated herein by reference.

BACKGROUND OF THE INVENTION

1. Field of the Invention

The present invention relates to a nonvolatile semiconductor memory device and a method for manufacturing or fabricating the nonvolatile semiconductor memory devices.

2. Description of the Related Art

In recent years, the EEPROM (Electrically Erasable and Programmable Read Only Memory) is finding rapidly increasing use as the fields of application, such as mobile phones and digital cameras, keep expanding. An EEPROM that has a capability of entire or block erasure of data electrically is called a flash EEPROM.

An EEPROM is a nonvolatile semiconductor memory device that stores binary or multi-level (multi-valued) digital information depending on whether a predetermined amount of electric charge is accumulated in a floating gate or not and reads out the digital information according to a change in current flow through a channel region relative to the amount of electric charge.

With the conventional EEPROM, it is necessary to apply a voltage on a control gate, which is stacked on the floating gate, in order to transfer electric charge to and from the floating gate. Hence, there must be provided a wiring for the control gate for each memory cell, which results in a complex structure of a memory cell. Also, with the conventional EEPROM, it is necessary to apply a high voltage to a source or a drain in order to inject electrical charge into or eject it from the floating gate.

In the manufacture of the conventional EEPROM, the process for fabricating a control gate is a requisite, presenting a problem of incompatibility with a logic process. Especially when an EEPROM is used for small-capacity data storage of several bytes or when there is a mixed presence of logic circuitry and EEPROM, the necessity for a fabrication process of the EEPROM independently of the logic process raises manufacturing costs.

SUMMARY OF THE INVENTION

The present invention has been made to resolve problems cited above and one advantage thereof resides in providing a technology for simplifying the structure of a nonvolatile semiconductor memory device. Another advantage thereof resides in providing a technology for reducing the manufacturing costs of the nonvolatile semiconductor memory devices by improving the compatibility between the fabrication process and the logic process. Still another advantage thereof resides in providing a technology for lowering the applied voltage at write and erase of the nonvolatile semiconductor memory device.

One embodiment of the present invention relates to a nonvolatile semiconductor memory device. This nonvolatile semiconductor memory device comprises: a semiconductor substrate of a first conductivity type; a gate insulator provided on the semiconductor substrate; a floating gate provided on the gate insulator; a first impurity diffusion layer, provided within the semiconductor substrate, of a second conductivity type which is opposite to the first conductive type and is separated apart from the floating gate; and a second impurity diffusion layer, provided within the semiconductor substrate, of the second conductivity type, which overlaps with the floating gate. In this embodiment, by applying a high voltage to the second impurity diffusion layer at the time of a write operation, the second impurity diffusion layer and the floating gate may be coupled together and electrons ejected from the first impurity diffusion layer may be injected into the floating gate.

By employing this embodiment, electrons can be injected into the floating gate by applying a high voltage to the second impurity diffusion layer in capacitive coupling with the floating gate. Hence, the structure of the nonvolatile semiconductor memory device can be simplified.

In the above-described embodiment, electrons accumulated in the floating gate may be ejected by applying a high voltage to the first impurity diffusion layer at the time of an erase operation.

In the above-described embodiment, a nonvolatile semiconductor memory device may further comprise: a fourth impurity diffusion layer of the second conductivity type; a fifth impurity diffusion layer, of the second conductivity type, which is provided separately apart from the fourth impurity diffusion layer; and another channel provided between the fourth impurity diffusion layer and the fifth impurity diffusion layer, said another channel being different from a channel region provided between said first impurity diffusion layer and said second impurity diffusion layer, wherein the floating gate may overlap with the another channel region.

Another embodiment of the present invention relates to a method for manufacturing a nonvolatile semiconductor memory device. This method for manufacturing a nonvolatile semiconductor memory device comprises the processes of: forming a floating gate on a semiconductor substrate of a first conductivity type through the medium of an insulating film; injecting a first impurity of a second conductivity type which is opposite to the first conductivity type, within the semiconductor substrate at one side of the floating gate; forming a side-wall insulating film on each side wall of the floating gate; injecting a second impurity of a second conductivity into an outer region of the each side-wall insulating film within the semiconductor substrate wherein the diffusion rate of thermal diffusion of the second impurity of the second conductivity is lower than that of the first impurity; and overlapping a diffusion region of the first impurity with the floating gate by subjecting the first impurity to thermal diffusion.

By employing the method, for manufacturing a nonvolatile semiconductor memory device, according to this embodiment, the process of fabricating the control gate is eliminated. As a result, the fabrication process of the nonvolatile semiconductor memory device is highly compatible with that of a logic process. Thus the fabrication of the nonvolatile semiconductor memory device can be carried out in parallel with the fabrication of a logic circuit. This leads to the reduction in manufacturing costs.

In the above-described fabrication method, a P-type Si substrate may be used for the semiconductor substrate, and P and As may be used for the first impurity and the second impurity, respectively.

Still another embodiment of the present invention relates also to a nonvolatile semiconductor memory device. This nonvolatile semiconductor memory device comprises: a semiconductor substrate of a first conductivity type; a gate insulator provided on the semiconductor substrate; a floating gate provided on the gate insulator; a first impurity diffusion layer, provided within the semiconductor substrate, of a second conductivity type which is opposite to the first conductive type, the first impurity diffusion layer being provided separately apart from the floating gate; and a second impurity diffusion layer, of the second conductivity type, which is provided near the floating gate within the semiconductor substrate; and a third impurity diffusion layer, of the second conductivity type, which is provided separately apart from a channel region provided between the first impurity diffusion layer and the second impurity diffusion layer, wherein the floating gate overlaps with the channel region and the third impurity diffusion layer. In this embodiment, by applying a high voltage to the third impurity diffusion layer and applying a voltage lower than the high voltage to the second impurity diffusion layer at the time of a write operation, third impurity diffusion layer may be in capacitive coupling with the floating gate, and electrons ejected from the first impurity diffusion layer may be injected into the floating gate.

By employing this embodiment, the use of a control gate stacked on the floating gate is eliminated, and the electrons can be injected into the floating gate by applying a high voltage to the third impurity diffusion layer in capacitive coupling with the floating gate. Hence, the structure of the nonvolatile semiconductor memory device can be further simplified. The voltage applied to the second impurity diffusion layer can be reduced by applying a high voltage to the third impurity diffusion layer in capacitive coupling with the floating gate.

In the above-described embodiment, electrons accumulated in the floating gate may be ejected by applying a high voltage to the first impurity diffusion layer at the time of an erase operation.

In the above-described embodiment, when a high voltage is applied to the first impurity diffusion layer at the time of an erase operation, electrons accumulated in the floating gate may be partially ejected according to a voltage applied to the third impurity diffusion layer.

According to this embodiment, multi-level (multi-valued), rather than binary, information can be stored in a single memory cell by optionally changing the amount of electric charge to be held by the floating gate.

In the above-described embodiment, a side-wall insulating film may be provided on each side wall of the floating gate, and a separation distance between the floating gate and the first impurity diffusion layer may be equal to a bottom thickness of the side-wall insulating film.

In the above-described embodiment, a nonvolatile semiconductor memory device may further comprise: a fourth impurity diffusion layer of the second conductivity type; a fifth impurity diffusion layer, of the second conductivity type, which is provided separately apart from the fourth impurity diffusion layer; and another channel provided between the fourth impurity diffusion layer and the fifth impurity diffusion layer, wherein the floating gate may overlap with the another channel region.

Still another embodiment of the present invention relates to a method for manufacturing a nonvolatile semiconductor memory device. This method for manufacturing a nonvolatile semiconductor memory device comprises: a first process of injecting an impurity of a second conductivity type, which is opposite to a first conductivity type, into a second impurity diffusion layer near a channel region within a semiconductor substrate of the first conductivity type and a third impurity diffusion layer provided separately apart from the channel region, respectively; a second process of forming a floating gate on the semiconductor substrate through the medium of an insulating film in a manner such that the channel region and the third impurity diffusion layer overlap with each other; a third process of forming a side-wall insulating film on each side wall of the floating gate; and a fourth process of injecting an impurity of the second conductivity type into an outer region of the each side-wall insulating film of the floating gate on a side opposite to the second impurity diffusion layer.

According to this embodiment, a nonvolatile semiconductor memory device can be manufactured where the electrons can be injected into the floating gate by applying a high voltage to the third impurity diffusion layer coupled with the floating gate without the use of a control gate stacked on the floating gate.

In the first process of the manufacturing method according to the above-described embodiment, an impurity of the second conductivity type may be injected into a channel region of a depression-type MOSFET manufactured in parallel with the nonvolatile semiconductor memory device.

As a result, the ion injection into the channel region of the depression-type MOSFET and the ion injection into the second diffusion layer and the third diffusion layer can be carried out in the same process. This leads to the simplification of the manufacturing process of semiconductor integrated circuits where both logic circuitry and nonvolatile semiconductor memory devices are mixed and thus leads to the reduction in manufacturing costs.

Still another embodiment of the present invention relates also to a nonvolatile semiconductor memory device. This nonvolatile semiconductor memory device comprises: a semiconductor substrate of a first conductivity type; a gate insulator provided on the semiconductor substrate; a floating gate provided on the gate insulator; a first impurity diffusion layer, provided within the semiconductor substrate, of a second conductivity type which is opposite to the first conductive type, the first impurity diffusion layer being provided separately apart from the floating gate; and a second impurity diffusion layer of the second conductivity type which is provided near the floating gate within the semiconductor substrate, wherein the floating gate has a main region corresponding to a channel width of a channel region between the first impurity diffusion layer and the second impurity diffusion layer and an extended region extending externally in a channel width direction of the main region, and wherein the second impurity diffusion layer overlaps with the floating gate in the extended region. In this embodiment, the second impurity diffusion layer may overlap with the floating gate in the extended region in such a manner that the second impurity diffusion layer extends around at least one side of the channel region.

In the above-described embodiment, a main region of the second impurity diffusion layer may overlap with the floating gate within the semiconductor substrate.

By employing the nonvolatile semiconductor memory device according to each of the above-described embodiments, the electrons can be injected into the floating gate by applying a high voltage to the second impurity diffusion layer coupled with the floating gate without the use of the control gate stacked on the floating gate. Hence, the structure of the nonvolatile semiconductor memory device can be further simplified.

Also, the partial overlapping of the extended region of the floating gate and the second impurity diffusion layer can enlarge the region where the floating gate and the second impurity diffusion layer overlap each other, with the result of an increased coupling capacitance. The increased coupling capacitance can lower the voltage to be applied to the second impurity diffusion layer in a write operation and the voltage to be applied to the first impurity diffusion layer in an erase operation.

Also, a side-wall insulating film may be provided on each side wall of the floating gate, and a separation distance between the floating gate and the first impurity diffusion layer may be equal to a bottom thickness of the side-wall insulating film.

A nonvolatile semiconductor memory device may further comprise: a fourth impurity diffusion layer of the second conductivity type; a fifth impurity diffusion, of the second conductivity type, which is provided separately apart from the fourth impurity diffusion layer; and another channel provided between the fourth impurity diffusion layer and the fifth impurity diffusion layer, wherein the extended region of the floating gate may overlap with the another channel region (hereafter this will be referred as Embodiment A).

Still another embodiment of the present invention relates to a nonvolatile memory array. This nonvolatile memory array comprises: a nonvolatile semiconductor memory device, according to Embodiment A, disposed in a matrix; a first transistor connected to the second impurity diffusion layer of the nonvolatile semiconductor memory device; a second transistor connected to the fourth impurity diffusion layer; an erase line connected commonly to the first impurity diffusion layers of the nonvolatile semiconductor memory device; a word line connected commonly to a gate electrode of the first transistor and a gate electrode of the second transistor; a write bit line connected commonly to drains of the first transistor; and a read bit line connected commonly to drains of the second transistor.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIGS. 6A to 6C are circuit diagrams of nonvolatile semiconductor memory devices arranged in a matrix;

FIGS. 11A(i) to 11D(i) and FIGS. 11A(ii) to 11D(ii) are cross-sectional views showing processes of manufacturing a nonvolatile semiconductor memory device according to a second embodiment of the present embodiment;

FIGS. 12A(i) to 12C(i) and FIGS. 12A(ii) to 12C(ii) are cross-sectional views showing processes of manufacturing a nonvolatile semiconductor memory device according to a second embodiment of the present embodiment;

FIGS. 13(i) and 13(ii) are cross-sectional views showing processes of manufacturing a nonvolatile semiconductor memory device according to a second embodiment of the present embodiment;

FIGS. 18A(i) to 18D(i) and FIGS. 18A(ii) to 18D(ii) are cross-sectional views showing processes of manufacturing a nonvolatile semiconductor memory device according to a fifth embodiment of the present embodiment;

FIGS. 19A(i) to 19C(i) and FIGS. 19A(ii) to 19C(ii) are cross-sectional views showing processes of manufacturing a nonvolatile semiconductor memory device according to a fifth embodiment of the present embodiment;

FIGS. 20(i) and 20(ii) are cross-sectional views showing processes of manufacturing a nonvolatile semiconductor memory device according to a fifth embodiment of the present embodiment;

FIGS. 24A to 24C are each a circuit diagram of a nonvolatile memory array according to a first example of the present embodiments;

FIGS. 25A to 25C are each a circuit diagram of a nonvolatile memory array according to a second example of the present embodiments; and FIGS. 26A to 26C are each a circuit diagram of a nonvolatile memory array according to a third example of the present embodiments.

DETAILED DESCRIPTION OF THE INVENTION

Figure 1:
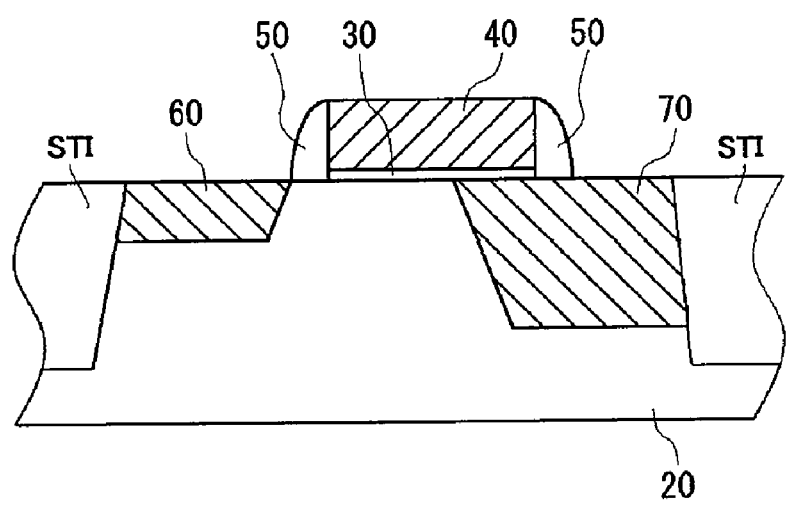
FIG. 1 is a cross-sectional view showing a structure of a nonvolatile semiconductor memory device according to a first embodiment of the present invention.

The invention will now be described by reference to the preferred embodiments. This does not intend to limit the scope of the present invention, but to exemplify the invention.

The embodiments will now be described with reference to drawings. Note that in all of the Figures the same components are given the same reference numerals and the repeated description thereof is omitted as appropriate.

First Embodiment

FIG. 1 is a cross-sectional view showing a structure of a nonvolatile semiconductor memory device 10 according to a first embodiment of the present invention. The nonvolatile semiconductor memory device 10 comprises memory cells, each of which includes a semiconductor substrate 20, a gate insulator 30, a floating gate 40, a side-wall insulating film 50, a diffusion layer 60, which is a first impurity diffusion region, and a diffusion layer 70, which is a second impurity diffusion region.

The gate insulator 30 is disposed on the semiconductor substrate 20. A P-type Si substrate, for instance, may be used as the semiconductor substrate 20. A silicon oxide film, for instance, may be used as the gate insulator 30.

The floating gate 40 is provided on the semiconductor substrate 20 through the medium of the gate insulator 30. A polysilicon, for instance, may be used as the floating gate 40. A side-wall insulating film 50 is provided on each side wall of the floating gate 40. A silicon oxide film, for instance, may be used as the side-wall insulating film 50.

The diffusion layer 60 and the diffusion layer 70 are both n+ type diffusion layers.

The diffusion layer 60, which occupies a space within the semiconductor substrate 20, is a predetermined distance separate from the floating gate 40. The separation distance between the diffusion layer 60 and the floating gate 40 is equal to the bottom thickness of the side-wall insulating film 50.

The diffusion layer 70, which occupies a space within the semiconductor substrate 20, overlaps partially with the floating gate 40. Also, the depth of the diffusion layer 70 is greater than that of the diffusion layer 60.

It is to be noted that, as will be discussed later, the length for which the diffusion layer 70 overlaps the floating gate 40 may be adequate if it ensures a sufficient coupling capacitance between the diffusion layer 70 and the floating gate 40. However, in overlapping the diffusion layer 70 with the floating gate 40, care must be taken not to allow a punch-through phenomenon between the diffusion layer 60 and the diffusion layer 70.

Figure 2A:
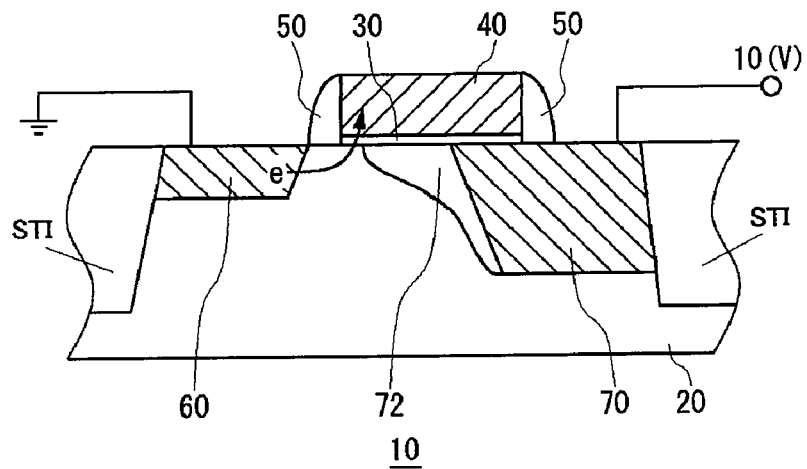
FIG. 2A shows a write operation of a nonvolatile semiconductor memory device according to a first embodiment of the present invention.

Now a description will be given of an operation of a nonvolatile semiconductor memory device 10 by referring to FIGS. 2A to 2C.

(Write Operation)

A write operation takes place in a state where electrons (electric charge) have been ejected from the floating gate 40 by an erase operation to be described later. More specifically, as shown in FIG. 2A, when the diffusion layer 60 is set for a low voltage (e.g., 0 V) and the diffusion layer 70 is set for a high voltage (e.g., 10 V), a depletion layer 72 is formed in a channel region from the diffusion layer 70 toward the diffusion layer 60, and as a result the electric field between the depletion layer 72 and the diffusion layer 60 becomes strong. As a consequence, hot electrons having an energy in excess of the energy barrier of the gate insulating film 30 occur in the neighborhood of the diffusion layer 60. These hot electrons are injected into the floating gate 40, attracted by the voltage (e.g., 8 V) of the floating gate 40 in capacitive coupling with the diffusion layer 70. This turns the memory cell into a written state, and the potential of the floating gate 40 drops. More specifically, when the diffusion layer 70 is set for a low voltage, the potential of the floating gate 40 drops to a level where potential at the interface of the semiconductor substrate 20 below the floating gate cannot be inverted.

(Erase Operation)

Figure 2B:
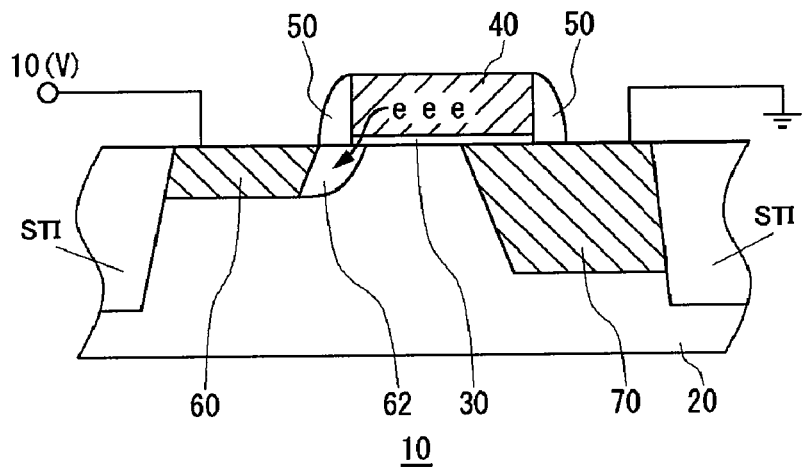
FIG. 2B shows an erase operation of a nonvolatile semiconductor memory device according to a first embodiment of the present invention.

In an erase operation, as shown in FIG. 2B, the diffusion layer 60 is set for a high voltage (e.g., 10 V) and the diffusion layer 70 is set for a low voltage (e.g., 0 V). This results in the formation of a depletion layer 62 in the vicinity of the diffusion layer 60, and by Fowler-Nordheim tunneling, electrons accumulated in the floating gate 40 are released to the depletion layer 62. This turns the memory cell into an erased state, and the potential of the floating gate 40 rises. In other words, when the diffusion layer 70 is set for a low voltage, the potential at the floating gate 40 rises to a level where the potential at the interface of the semiconductor substrate 20 below the floating gate is inverted.

(Read Operation)

Figure 2C:
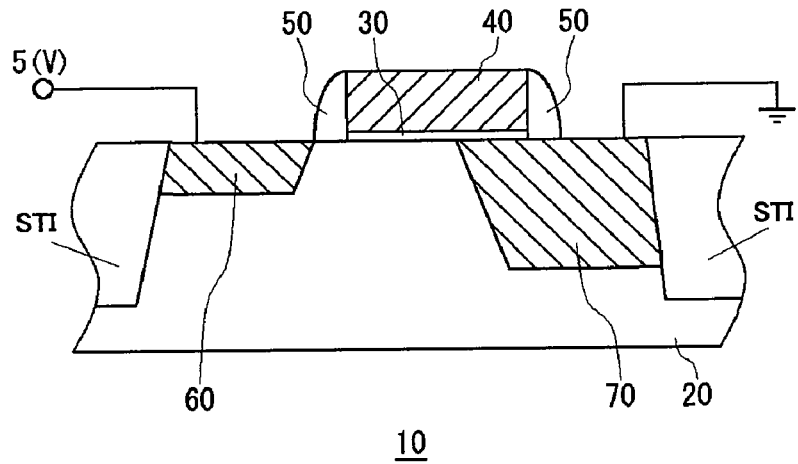
FIG. 2C shows a read operation of a nonvolatile semiconductor memory device according to a first embodiment of the present invention.

In a read operation, as shown in FIG. 2C, the diffusion layer 60 is set for an intermediate voltage (e.g., 5 V) and the diffusion layer 70 is set for a low voltage (e.g., 0 V). At this time, if the memory cell is in an erased state, a current will flow between the diffusion layer 60 and the diffusion layer 70. On the other hand, if the memory cell is in a written state, no current will flow between the diffusion layer 60 and the diffusion layer 70. Thus, information stored in the floating gate 40 is read out according to the above-mentioned current. It is to be noted, however, that a depletion layer exceeding the separation distance between the diffusion layer 60 and the floating gate 40 must be formed within the semiconductor substrate 20 by the voltage applied to the diffusion layer 60.

With the nonvolatile semiconductor memory device 10 as described above, the write operation can be effected merely by the application of a high voltage to the diffusion layer 70 in capacitive coupling with the floating gate 40 without the use of a control gate. This feature contributes to the simplification and miniaturization of the structure of the memory cell.

(Fabrication Method)

Now a method for fabricating a nonvolatile semiconductor memory device 10 will be described with reference to FIG. 3 and FIG. 4. The fabrication of the nonvolatile semiconductor memory device 10 can be carried out in parallel with the fabrication of MOSFET as will be discussed later.

Figure 3A:
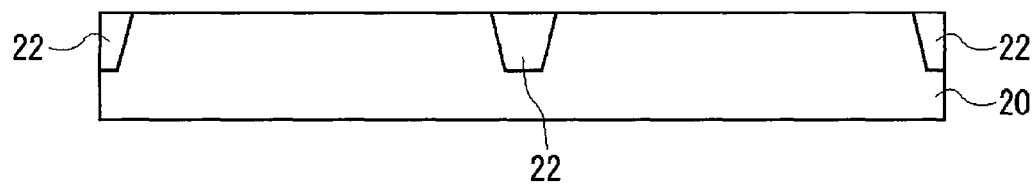
FIGS. 3A to 3D are cross-sectional views showing processes of manufacturing a nonvolatile semiconductor memory device according to a first embodiment of the present embodiment.

First, as shown in FIG. 3A, a semiconductor substrate 20 is prepared which is a P-type silicon (Si) substrate with the elements isolated from one another by a silicon oxide film 22, which is formed by a known technique such as shallow trench isolation (STI) technique.

Figure 3B:
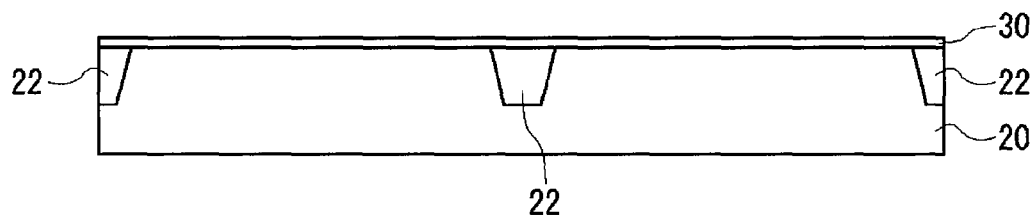

Next, as shown in FIG. 3B, a gate insulator 30 made of silicon oxide is formed by a thermal oxidation method on the surface layer of the semiconductor substrate 20.

Figure 3C:
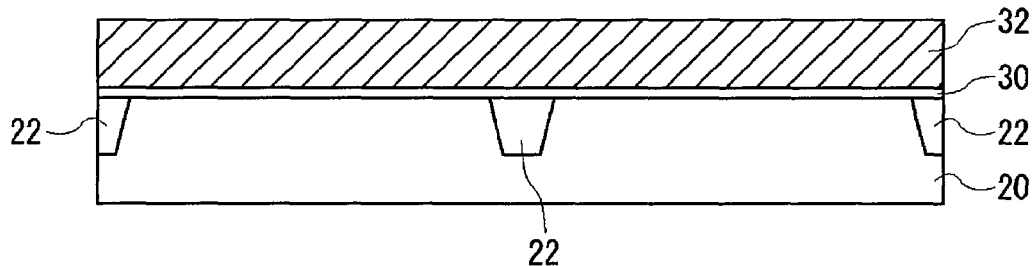

Next, as shown in FIG. 3C, a polysilicon film 32 is formed on the gate insulator 30. Note that the resistance value of the polysilicon film 32 may be controlled by doping it with boron (B) or phosphorous (P) during or after the formation thereof.

Figure 3D:
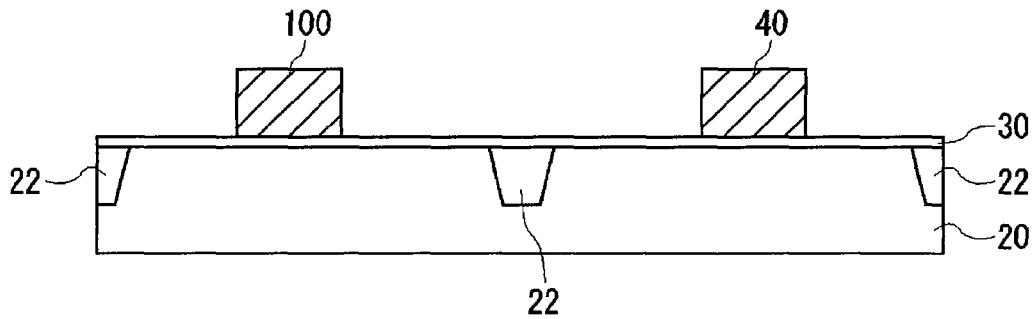

Next, as shown in FIG. 3D, a floating gate 40 and a gate electrode 100 are formed by selectively removing predetermined regions of the polysilicon film 32 by photolithography and dry etching methods. At this time, the floating gate 40 is formed such that the width thereof is greater than the width of the channel (width of the diffusion layer 60).

Figure 4A:
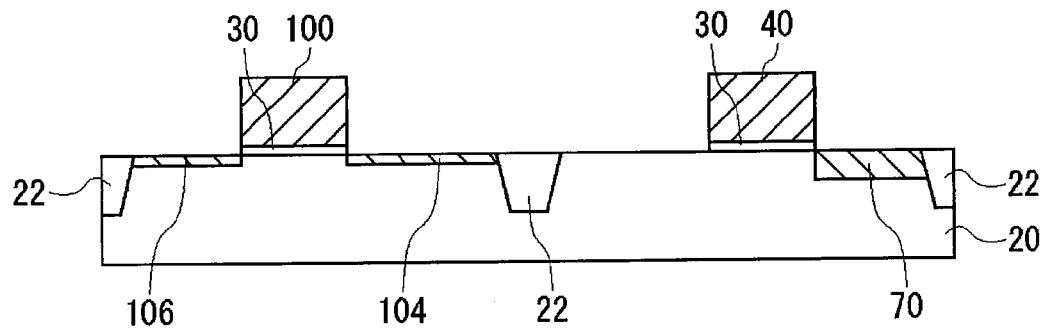
FIGS. 4A to 4C are cross-sectional views showing processes of manufacturing a nonvolatile semiconductor memory device according to a first embodiment of the present embodiment.

Then, as shown in FIG. 4A, after removing the exposed part of the gate insulator 30 by etching, phosphorous (P) as an N-type impurity is ion-injected into the diffusion layer 70 using a mask (not shown) having an opening on one side of the floating gate 40 (opposite side of the gate electrode 100 in this embodiment). Also, arsenic (As) is shallowly injected into a source region 104 and a drain region 106, which are on their respective sides of the gate electrode 100, using a mask (not shown).

Figure 4B:
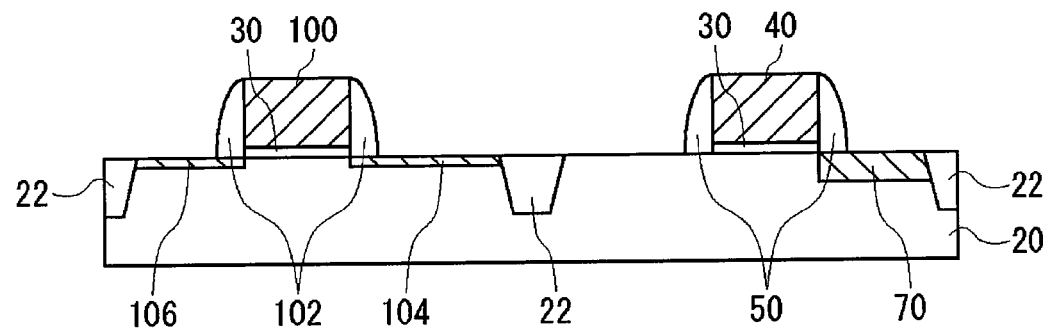

Next, a silicon oxide film (not shown) is deposited on the whole top surface of the semiconductor substrate 20. Then, as shown in FIG. 4B, the silicon oxide film is etched back by anisotropic dry etching to leave the silicon oxide film on each side wall only of the floating gate 40 and the gate electrode 100. As a result, side-wall insulating films 50 and 102 are formed as side walls of the floating gate 40 and the gate electrode 100, respectively.

Figure 4C:
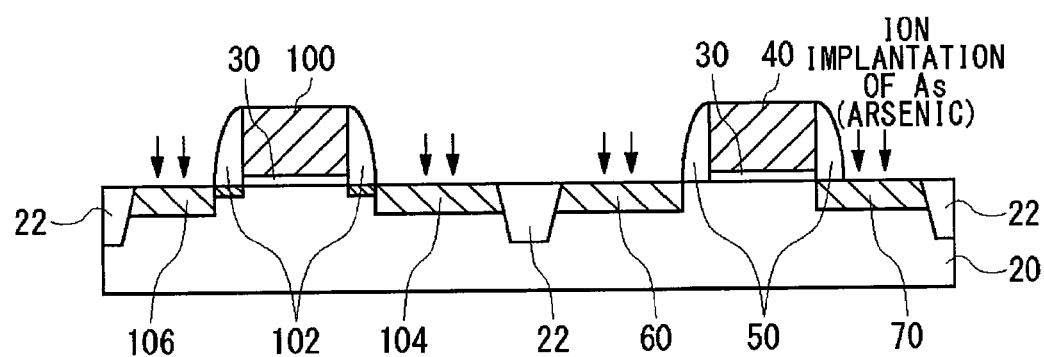

Next, as shown in FIG. 4C, As ions are injected into the top surface of the semiconductor substrate 20. As a result, the diffusion layer 60 and the diffusion layer 70 are doped with As in self-alignment with the side-wall insulating films 50. Also, the source region 104 and the drain region 106 are formed in self-alignment with the side-wall insulating films 102.

Figure 5:
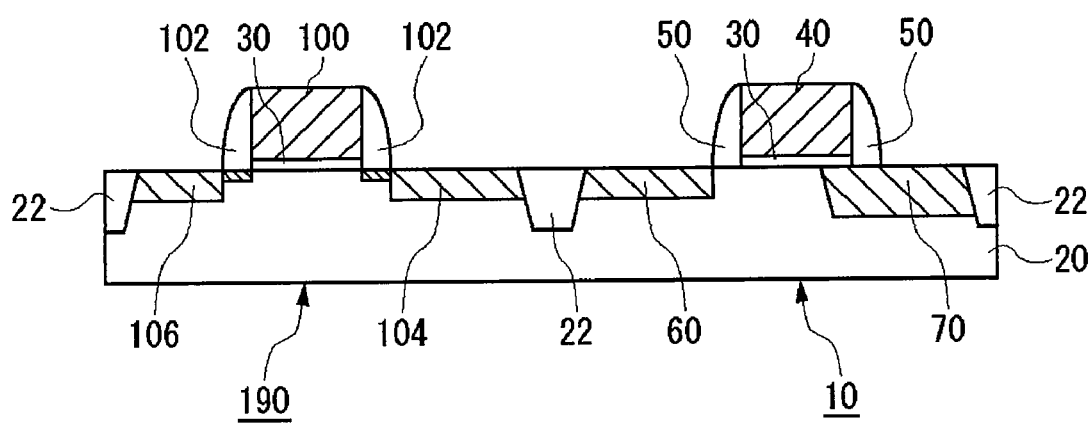
FIG. 5 is a cross-sectional view showing a process of manufacturing a nonvolatile semiconductor memory device according to a first embodiment of the present embodiment.

Next, as shown in FIG. 5, the diffusion layer 70 is subjected to a thermal diffusion treatment. Since the diffusion rate of phosphorous (P) is greater than that of arsenic (As), the diffusion occurs mainly in the phosphorous (P). Through this process, the diffusion layer 70 is overlapped with the floating gate 40 in a planar direction of the semiconductor substrate 20 while the offset of the diffusion layer 60 and the floating gate 40 is maintained. Also, the diffusion layer 70 becomes deeper than the diffusion layer 60.

Through the above-described processes, a nonvolatile semiconductor memory device 10 and a MOSFET 190 are fabricated. The fabrication process of the nonvolatile semiconductor memory device 10 is highly compatible with that of the MOSFET 190, so that they can be produced in parallel with each other. This results in the reduction in the number of processes and simplification of the whole manufacturing process. Especially when the nonvolatile semiconductor memory device 10 is used for small-capacity data storage of several bytes, the manufacturing costs can be greatly reduced because it is not necessary to carry out the fabrication of the nonvolatile semiconductor memory device 10 independently.

FIGS. 6A to 6C are circuit diagrams of nonvolatile semiconductor memory devices arranged in a matrix. The diffusion layer 60 of the nonvolatile semiconductor memory device 10 is connected to the source region 104 of the MOSFET 190. The diffusion layers 70 of nonvolatile semiconductor memory devices 10 adjacent to each other along a bit line 210 are each connected to a common source line 200. Also, the drain region 106 of the MOSFET 190 is connected to the bit line 210, and the gate electrode 100 of the MOSFET 190 is connected to a word line 220.

Note that, in the following description, the bit line 210 related to a cell 300, which is a cell of interest in write and other operations, will be called a bit line 210a, and the bit line 210 not related thereto will be called a bit line 210b. Also, the word line 220 related to a cell 300, which is a cell of interest herein, will be called a word line 220a, and the word line 220 not related thereto will be called a word line 220b.

For a write operation of the cell 300 of interest, the bit line 210a is set to 0 V, and the bit line 210b is set to 5 V or open. Also, the word line 220a is set to 5 V, and the word line 220b to 0 V. Also, the source line 200 is set to 10 V. Then the MOSFET 190 in the cell 300 of interest turns on, and the diffusion layer 60 of the nonvolatile semiconductor memory device 10 is set to 0 V. On the other hand, the diffusion layer 70 of the nonvolatile semiconductor memory device 10 is set to 10 V. As a result, a state of write operation illustrated in FIG. 2A of the nonvolatile semiconductor memory device 10 is created, with electrons being injected into the floating gate of the nonvolatile semiconductor memory device 10 of the cell 300 of interest.

As for the cells other than the cell 300 of interest, the injection of electrons into the floating gate does not occur because the MOSFET 190 turns off or there is not sufficient potential difference between the diffusion layer 60 and the diffusion layer 70.

For an erase operation of the cell 300 of interest, the bit line 210a is set to 10 V, and the bit line 210b is set to open. Also, the word line 220a is set to 12 V, and the word line 220b is set to 0 V. Also, the source line 200 is set to 0 V. Then the MOSFET 190 in the cell 300 of interest turns completely on, and a voltage of 10 V is applied to the diffusion layer 60 of the nonvolatile semiconductor memory device 10. On the other hand, the diffusion layer 70 of the nonvolatile semiconductor memory device 10 is set to 0 V. As a result, a state of erase operation illustrated in FIG. 2B of the nonvolatile semiconductor memory device 10 is created, with electrons being ejected from the floating gate of the nonvolatile semiconductor memory device 10 of the cell 300 of interest.

As for the cells other than the cell 300 of interest, the ejection of electrons accumulated in the floating gate does not occur because the MOSFET 190 turns off or there is not sufficient potential difference between the diffusion layer 60 and the diffusion layer 70.

For a read operation of the cell 300 of interest, the bit line 210a is set to 5 V, and the bit line 210b is set to an open state. Also, the word line 220a is set to 5 V, and the word line 220b is set to 0 V. Also, the source line 200 is set to 0 V. Then the MOSFET 190 in the cell 300 of interest turns on, and a voltage of 5 V is applied to the diffusion layer 60 of the nonvolatile semiconductor memory device 10. On the other hand, the diffusion layer 70 of the nonvolatile semiconductor memory device 10 is set to 0 V.

As a result, a state of read operation illustrated in FIG. 2C of the nonvolatile semiconductor memory device 10 is created. Thus, a current flows to the cell 300 of interest when there is not a sufficient accumulation of electrons in the floating gate of the nonvolatile semiconductor memory device 10 of the cell 300 of interest. On the other hand, no current flows to the cell 300 of interest when there is a sufficient accumulation of electrons in the floating gate of the nonvolatile semiconductor memory device 10 of the cell 300 of interest. Information stored in the cell 300 of interest can be read out by detecting this current. Note that no current flows to the other cells on the bit line 210a irrespective of whether there are electrons accumulated in the floating gate or not because the MOSFET 190 is in an off state.

Thus, the arrangement of the nonvolatile semiconductor memory device as described above enables the write, erase and read operations of the cell of interest only.

Second Embodiment

Figure 7A:
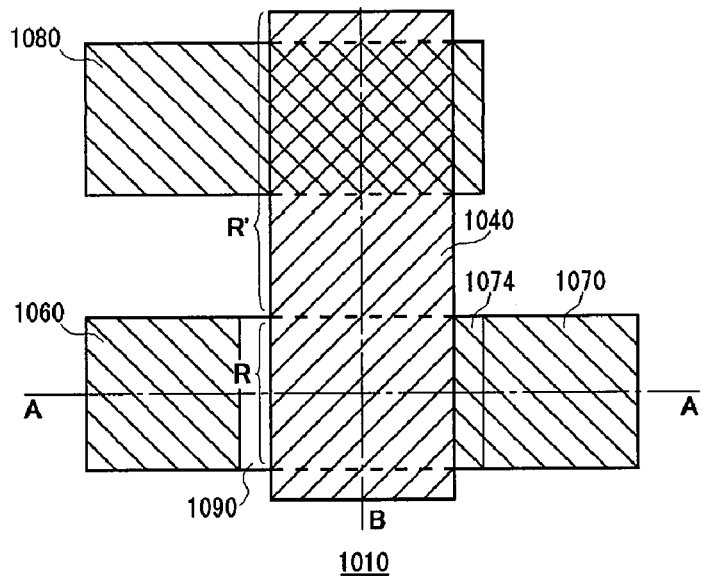
FIG. 7A is a feature plan view showing a structure of a nonvolatile semiconductor memory device according to a second embodiment of the present invention.
Figure 7B:
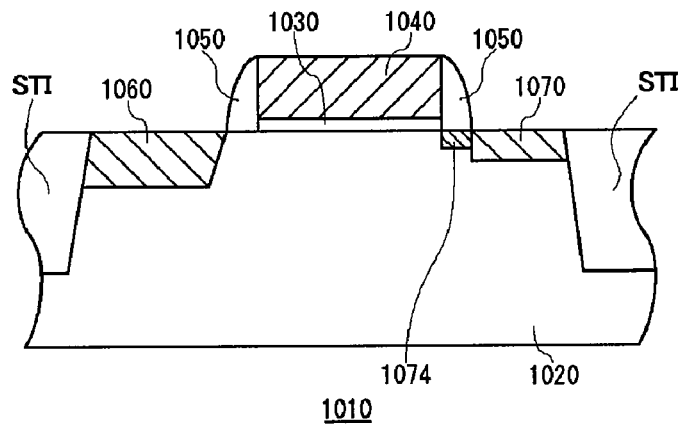
FIG. 7B is a cross-sectional view taken along the line A-A of FIG. 7A.
Figure 7C:
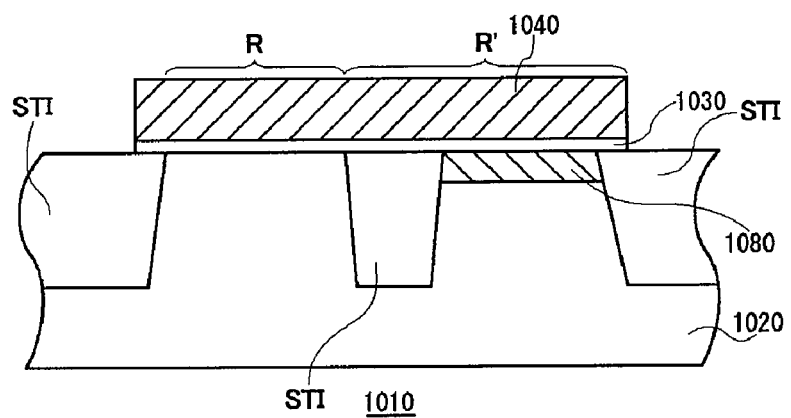
FIG. 7C is a cross-sectional view taken along the line B-B of FIG. 7A.

A nonvolatile semiconductor memory device 1010 according to a second embodiment of the present invention will be described below in conjunction with FIGS. 7A to 7C. FIG. 7A is a feature plan view showing a structure of the nonvolatile semiconductor memory device 1010 according to the second embodiment. FIG. 7B is a cross-sectional view taken along the line A-A of FIG. 7A. FIG. 7C is a cross-sectional view taken along the line B-B of FIG. 7A. The nonvolatile semiconductor memory device 1010 according to the second embodiment is a memory cell which includes a semiconductor substrate 1020, a gate insulator 1030, a floating gate 1040, a side-wall insulating film 1050, a diffusion layer 1060, which is a first impurity diffusion region, a diffusion layer 1070, which is a second impurity diffusion region, and a diffusion layer 1080, which is a third impurity diffusion region.

The gate insulator 1030 is disposed on the semiconductor substrate 1020. A P-type silicon substrate, for instance, may be used as the semiconductor substrate 1020. A silicon oxide film, for instance, may be used as the gate insulator 1030.

The floating gate 1040 is provided on the semiconductor substrate 1020 with a medium of the gate insulator 1030 disposed therebetween. A polysilicon, for instance, may be used as the floating gate 1040. A side-wall insulating film 1050 is provided on each side of the floating gate 1040. A silicon oxide film, for instance, may be used as the side-wall insulating film 1050. As shown in FIG. 7A, the floating gate 1040 has a main region R, which corresponds to the channel width of a channel region 1090 and overlaps therewith, and an extended region R', which extends on one side of the main region R in the channel width direction.

The diffusion layer 1060 and the diffusion layer 1070 are both n+ type diffusion layers.

The diffusion layer 1060, which occupies a space within the semiconductor substrate 1020, is a predetermined distance separate from the floating gate 1040. In the second embodiment, the separation distance between the diffusion layer 1060 and the floating gate 1040 is equal to the bottom thickness of the side-wall insulating film 1050.

The diffusion layer 1070 occupies a space within the semiconductor substrate 1020 in close proximity to the floating gate 1040. As shown in FIG. 7A, in the second embodiment, an extension layer 1074 of n+ type diffusion layer is provided inside the semiconductor substrate 1020 below the side-wall insulating film 1050. The channel region 1090 is formed between the diffusion layer 1060 and the extension layer 1074.

The diffusion layer 1080 is provided separately apart from the channel region 1090. As shown in FIG. 7A, the extended region R' of the floating gate 1040 overlaps partially with the diffusion layer 1080. It is to be noted that the length for which the diffusion layer 1080 overlaps the floating gate 1040 may be adequate if it ensures a sufficient coupling capacitance between the diffusion layer 1080 and the floating gate 1040.

Now a description will be given of an operation of the nonvolatile semiconductor memory device 1010 according to the second embodiment by referring to FIG. 8 to FIG. 10.

(Write Operation)

Figure 8A:
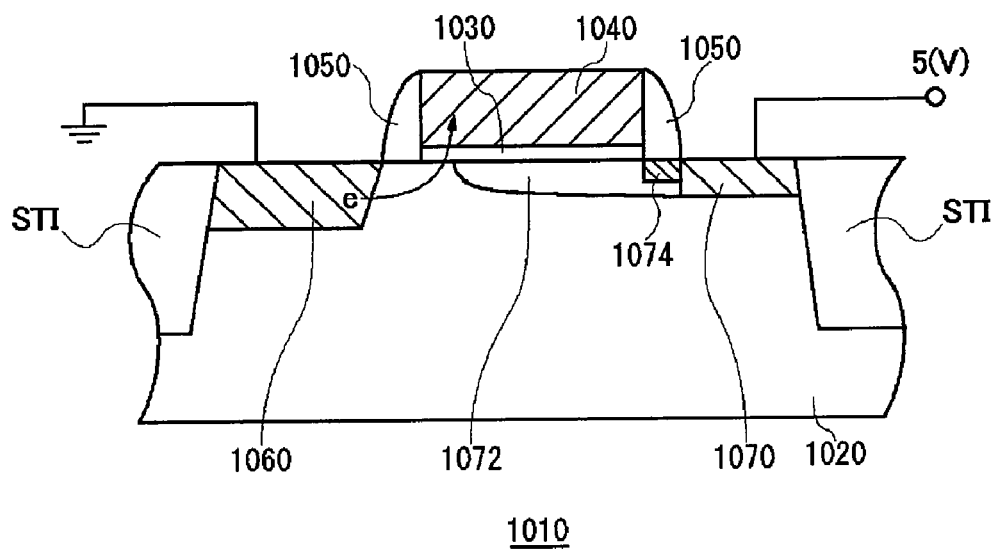
FIG. 8A and FIG. 8B each shows a write operation of a nonvolatile semiconductor memory device according to a second embodiment of the present invention.
Figure 8B:
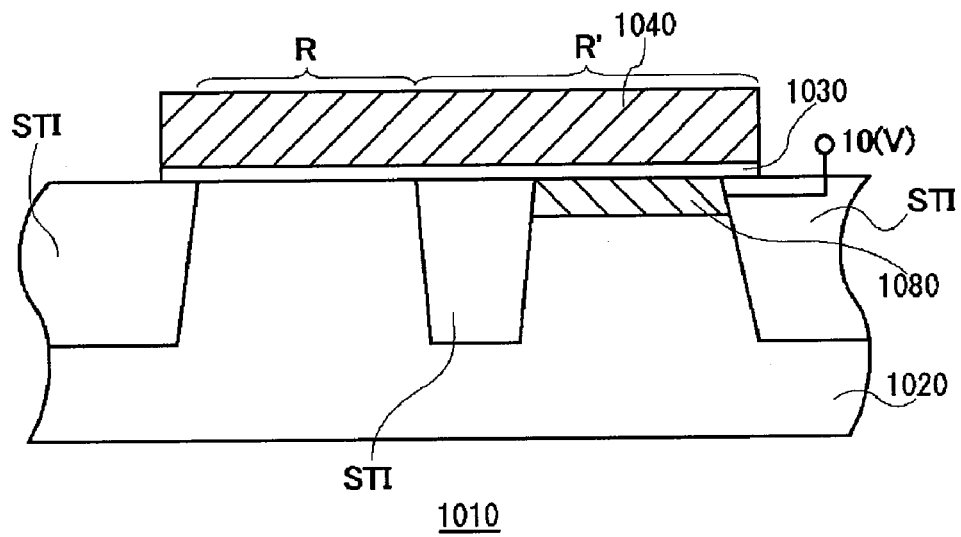

The write operation takes place in a state where electrons (electric charge) have been ejected from the floating gate 1040 by an erase operation to be described later. Specifically, as shown in FIGS. 8A and 8B, a low voltage (e.g., 0 V) is applied to the diffusion layer 1060, a high voltage (e.g., 10 V) is applied to the diffusion layer 1080, and an intermediate voltage (e.g., 5 V), which is lower than the high voltage applied to the diffusion layer 1080, is applied to the diffusion layer 1070. This causes the formation of a depletion layer 1072 in the channel region from the extension layer 1074 toward the diffusion layer 1060, and as a result the electric field between the depletion layer 1072 and the diffusion layer 1060 becomes strong. As a consequence, hot electrons having an energy in excess of the energy barrier of the gate insulator 1030 occur in the neighborhood of the diffusion layer 1060. These hot electrons are injected into the floating gate 1040, attracted by the voltage (e.g., 8V) of the floating gate 1040 in capacitive coupling with the diffusion layer 1080. This turns the memory cell into a written state, and the potential of the floating gate 1040 drops. In other words, when the diffusion layer 1070 and the diffusion layer 1080 are set for low voltage, the potential of the floating gate 1040 drops to a level where the interface of the semiconductor substrate 1020 below the floating gate 1040 cannot be inverted.

(Erase Operation)

Figure 9A:
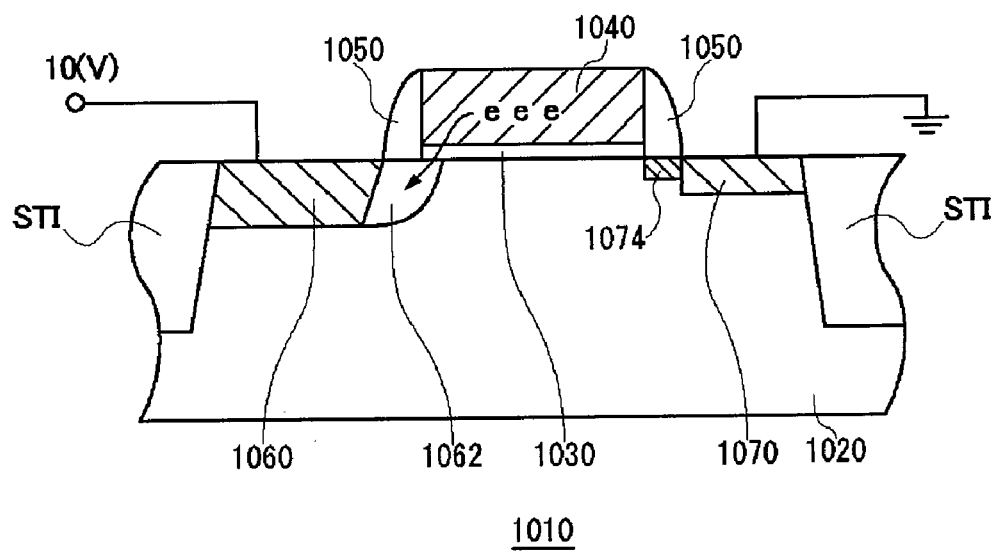
FIG. 9A and FIG. 9B each shows an erase operation of a nonvolatile semiconductor memory device according to a second embodiment of the present invention.
Figure 9B:
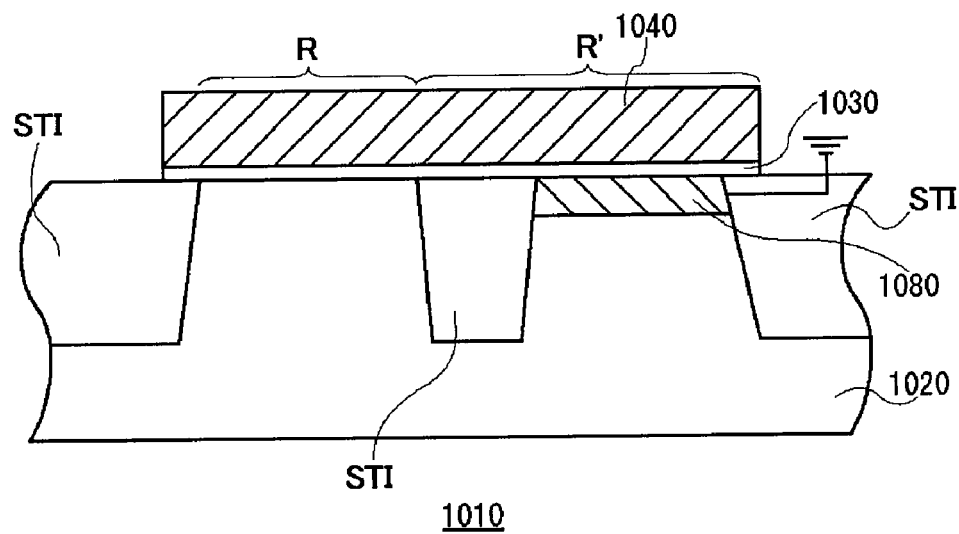

In an erase operation, as shown in FIGS. 9A and 9B, a high voltage (e.g., 10 V) is applied to the diffusion layer 1060, and a low voltage (e.g., 0 V) is applied to the diffusion layer 1070 and the diffusion layer 1080. This causes the formation of the depletion layer 1062 in the vicinity of the diffusion layer 1060, and by Fowler-Nordheim tunneling, electrons accumulated in the floating gate 1040 are released to the depletion layer 1062 through the medium of the gate insulator 1030. This turns the memory cell into an erased state, and the potential of the floating gate 1040 rises. In other words, when the diffusion layer 1070 and the diffusion layer 1080 are set for a low voltage, the potential of the floating gate 1040 rises to a level where the interface of the semiconductor substrate 1020 below the floating gate 1040 is inverted.

(Read Operation)

Figure 10A:
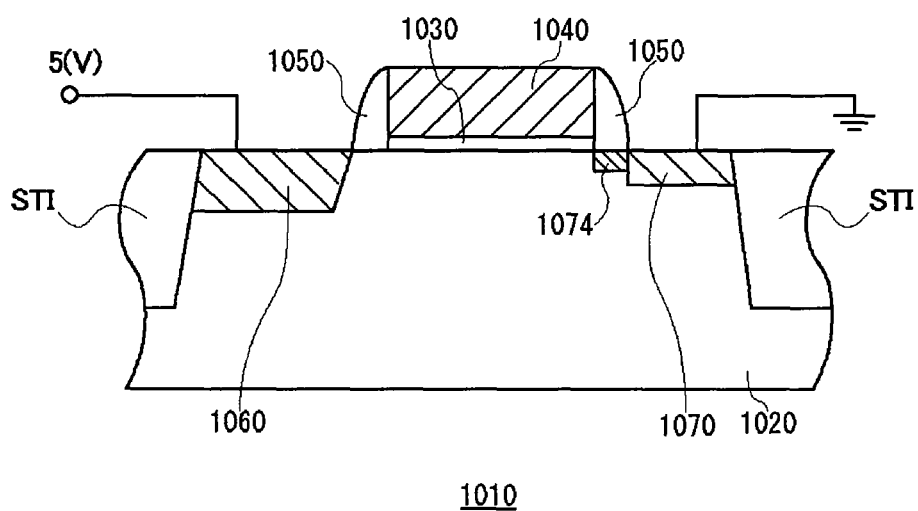
FIG. 10A and FIG. 10B each shows a read operation of a nonvolatile semiconductor memory device according to a second embodiment of the present invention.
Figure 10B:
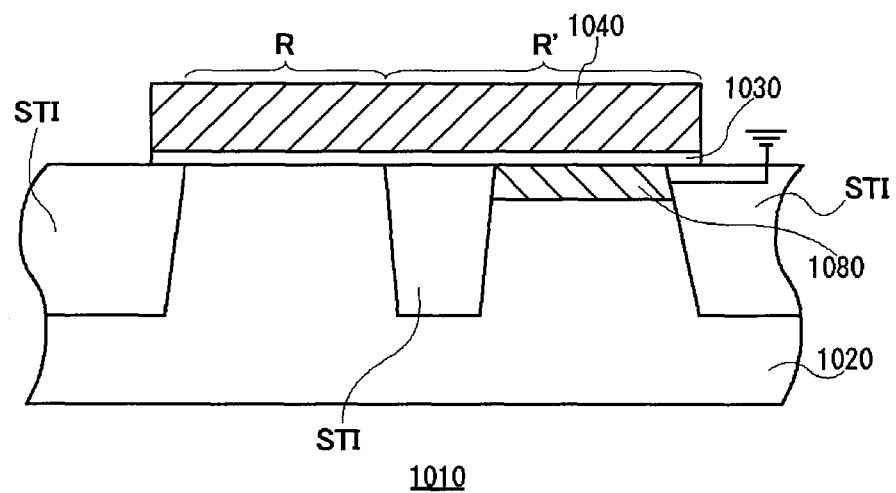

In a read operation, as shown in FIGS. 10A and 10B, an intermediate voltage (e.g., 5 V) is applied to the diffusion layer 1060, and a low voltage (e.g., 0 V) is applied to the diffusion layer 1070 and the diffusion layer 1080. At this time, if the memory cell is in an erased state, a current will flow between the diffusion layer 1060 and the diffusion layer 1070. On the other hand, if the memory cell is in a written state, no current will flow between the diffusion layer 1060 and the diffusion layer 1070. Thus, information stored in the floating gate 1040 is read out according to this current. It is to be noted, however, that a depletion layer exceeding the separation distance between the diffusion layer 1060 and the floating gate 1040 must be formed within the semiconductor substrate 1020 by the voltage applied to the diffusion layer 1060.

With the nonvolatile semiconductor memory device 1010 as described above, the write operation can be effected merely by the application of a high voltage to the diffusion layer 1080 in capacitive coupling with the floating gate 1040 and an intermediate voltage, which is lower than the high voltage applied to the diffusion layer 1080, to the diffusion layer 1070 without the use of the control gate stacked on the floating gate. This feature of this second embodiment contributes to the simplification and miniaturization of the structure of the memory cell.

(Fabrication Method)

Now a method for fabricating a nonvolatile semiconductor memory device 1010 according to the second embodiment will be described with reference to FIGS. 11 to 13. The fabrication of the nonvolatile semiconductor memory device 1010 can be carried out in parallel with the fabrication of a depression-type MOSFET as will be discussed later.

First, as shown in FIGS. 11A(i) and 11A(ii), a semiconductor substrate 1020 is prepared which is a P-type silicon substrate with the elements isolated from one another by a silicon oxide film 1022, which is formed by a known technique such as STI. Note that the left halves of (i) in FIGS. 11A to 11D, FIGS. 12A to 12C and FIG. 13 are cross-sectional views of a depression-type MOSFET, and the right halves thereof are cross-sectional views taken along the line A-A of FIG. 7A. Also, in FIGS. 11A to 11D, FIGS. 12A to 12C and FIG. 13, (ii) are cross-sectional views taken along the line B-B of FIG. 7A.

Next, as shown in FIGS. 11B(i) and 11B(ii), the diffusion layer 1070 and the diffusion layer 1080 are formed by injecting As ions into parts of a memory cell forming region M with the elements isolated from one another by a silicon oxide film 1022, by using a mask (not shown) having openings for the parts thereof. At the same time, a depression layer 1110 is formed by injecting As ions into a MOS forming region N including the channel region.

Next, as shown in FIGS. 11C(i) and 11C(ii), the gate insulator 1030 made of silicon oxide is formed by a thermal oxidation method on the surface layer of the semiconductor substrate 1020.

Next, as shown in FIGS. 11D(i) and 11D(ii), a polysilicon film 1032 is formed on the gate insulator 1030.

Then, as shown in FIGS. 12A(i) and 12A(ii), a floating gate 1040 and a gate electrode 1100 are formed by selectively removing predetermined regions of the polysilicon film 1032 by photolithography and dry etching methods. The floating gate 1040 thus formed has a main region R and an extended region R' as shown in FIG. 7A, and the extended region R' of the floating gate 1040 crosses over the diffusion layer 1080. That is, part of the extended region R' of the floating gate 1040 overlaps part of the diffusion layer 1080. While it is preferable that the main region R of the floating gate 1040 is close to the diffusion layer 1070 with a predetermined distance apart therefrom, the arrangement may be such that the main region R of the floating gate 1040 and the diffusion layer 1070 are next to each other without separation.

Next, as shown in FIGS. 12B(i) and 12B(ii), after removing the exposed part of the gate insulator 1030 by etching, arsenic (As) is shallowly injected into the extension layer 1074 between one of the side walls of the floating gate 1040 (opposite side of the gate electrode 1100 in this second embodiment) and the diffusion layer 1070, and the source region 1104 and the drain region 1106 on their respective sides of the gate electrode 1100 by using a mask (not shown) having the openings. As a result, the diffusion layer 1070 is in close proximity to the main region R of the floating gate 1040 self-aligningly with a medium of the extension layer 1074 in between.

Next, a silicon oxide film (not shown) is deposited on the whole top surface of the semiconductor substrate 1020. Then, as shown in FIGS. 12C(i) and 12C(ii), the silicon oxide film is etched back by anisotropic dry etching to leave the silicon oxide film on each side only of the floating gate 1040 and the gate electrode 1100. As a result, side-wall insulating films 1050 and 1102 are formed as side walls of the floating gate 1040 and the gate electrode 1100, respectively. Note that one of the side-wall insulating films 1050 is formed on top of the extension layer 1074.

Figure 13:
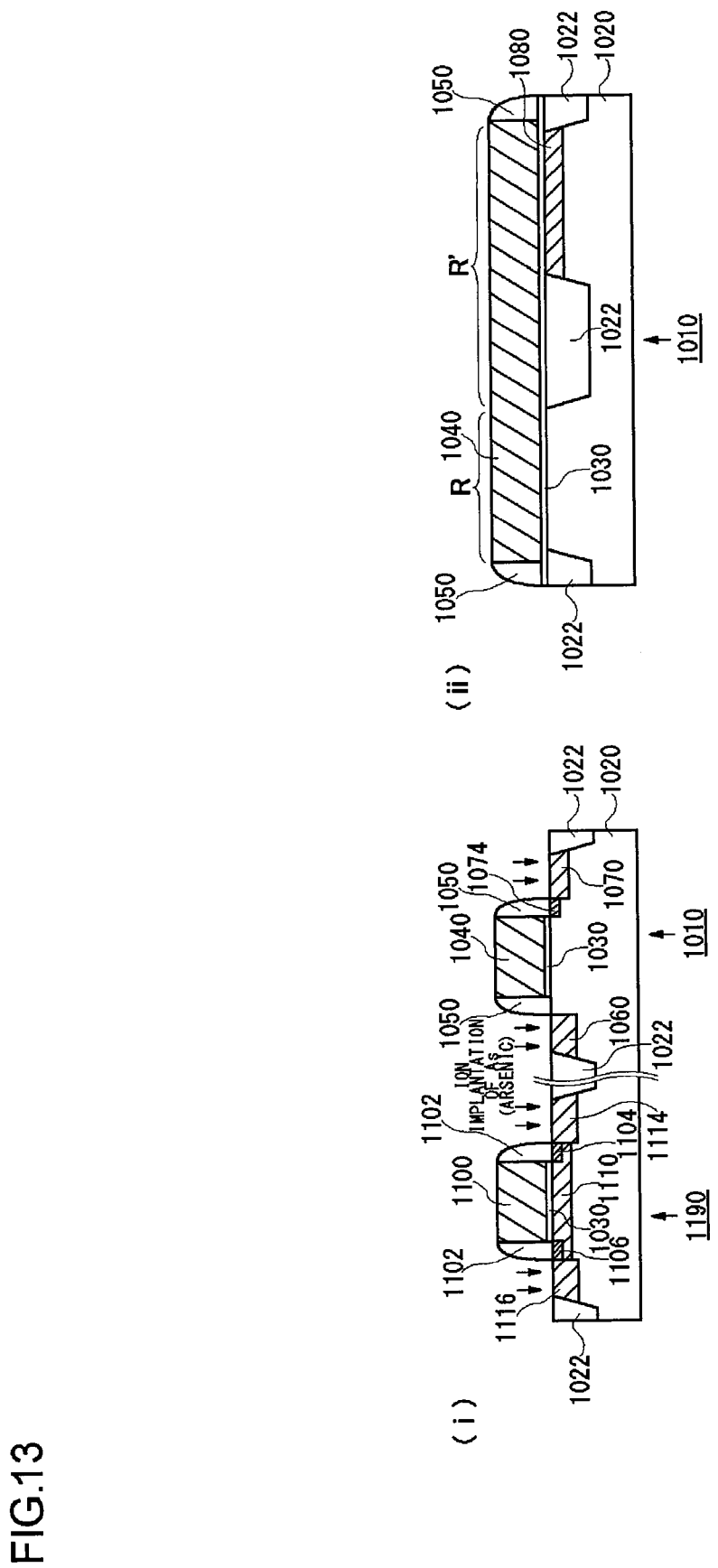

Then, as shown in FIGS. 13(i) and 13(ii), As ions are injected into the top surface of the semiconductor substrate 1020. As a result, the diffusion layer 1060 is doped with As in self-alignment with the side-wall insulating films 1050. Also, the source region 1114 and the drain region 1116 are formed in self-alignment with the side-wall insulating films 1102. Note also that the source region 1104 and the drain region 1106 become the extension layers of the source region 1114 and the drain region 1116, respectively.

Through the above-described processes, the nonvolatile semiconductor memory device 1010 and the depression-type MOSFET 1190 are fabricated in parallel with each other. As described above, the ion injection into the channel region of the depression-type MOSFET 1190 and the ion injection into the diffusion layer 1070 and the diffusion layer 1080 can be carried out in the same process. This leads to the simplification of the manufacturing process of semiconductor integrated circuits where both logic circuitry and nonvolatile semiconductor memory devices are mixed and thus leads to the reduction in manufacturing costs.

Third Embodiment

The structure of a nonvolatile semiconductor memory device according to a third embodiment of the present invention is the same as that of the second embodiment.

In this third embodiment, an arbitrary voltage higher than the voltage applied to the diffusion layer 1070 is applied to the diffusion layer 1080 in an erase operation as shown in FIGS. 9A and 9B. Initially the electrons accumulated in the floating gate 1040 are released into the depletion layer 1062 through the gate insulator 1030. And as the potential of the floating gate 1040 rises gradually, a current begins flowing between the diffusion layer 1060 and the diffusion layer 1070. Then the electric field strength near the edge of the diffusion layer 1060 attenuates, so that the process of the electrons accumulated in the floating gate 1040 being released into the depletion layer 1062 through the gate insulator 1030 stops midway. Hence, it is possible to optionally set a threshold voltage Vt of the memory cell by performing an erase operation that changes the potential of the diffusion layer 1080. In other words, multi-level (multi-valued), rather than binary, information can be stored in a single memory cell by optionally changing the amount of electric charge to be held by the floating gate 1040.

In a read operation, information corresponding to the multi-levels stored in the floating gate 1040 can be read out by changing the voltage applied to the diffusion layer 1080 according to the threshold voltage Vt of the memory cell.

According to the third embodiment as described above, a multi-valued operation can be performed by the nonvolatile semiconductor memory device.

Fourth Embodiment

Figure 14:
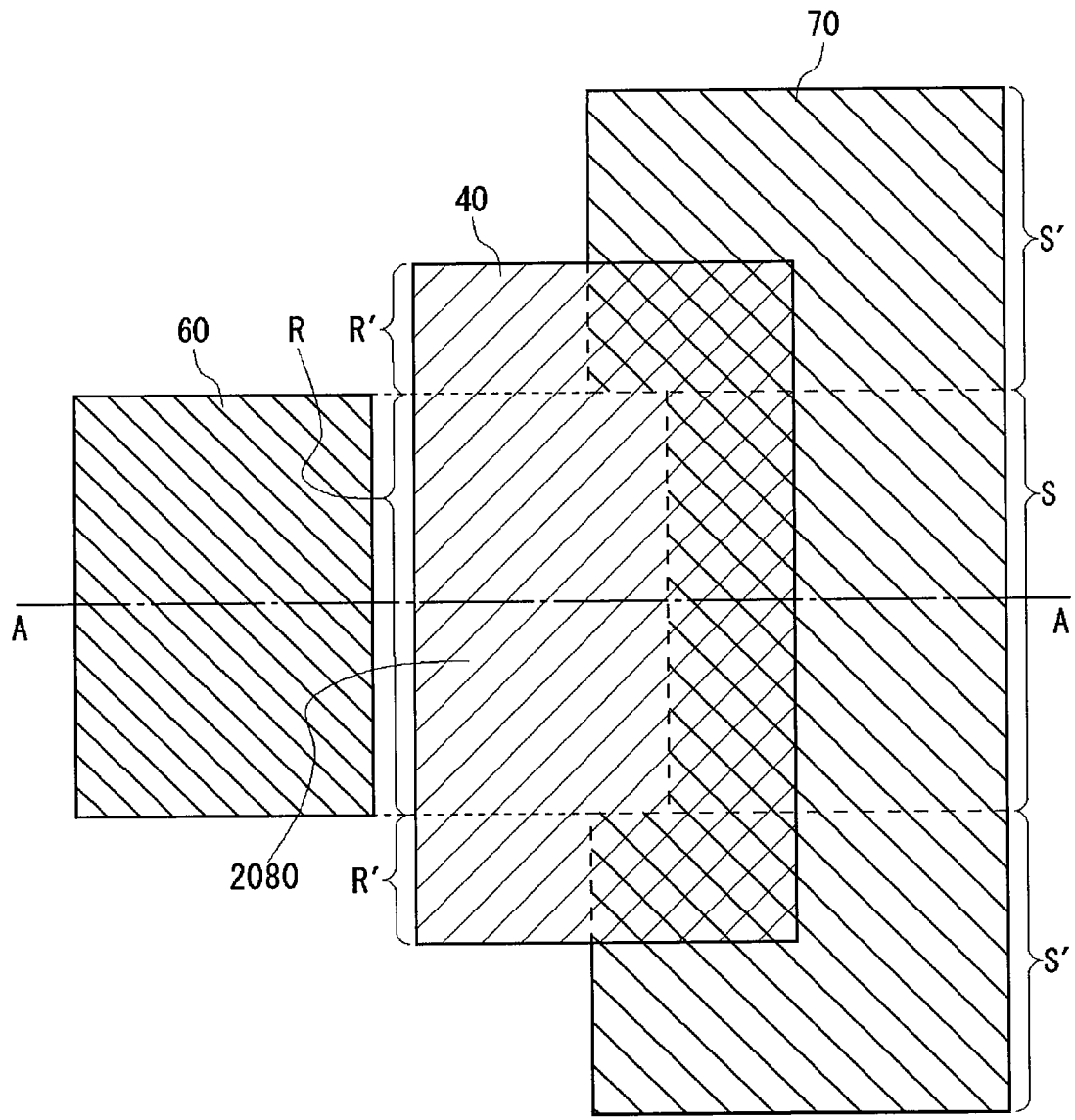
FIG. 14 is an illustration showing a positional relationship in a planar direction among a floating gate, a first impurity diffusion layer and a second impurity diffusion layer of a nonvolatile semiconductor memory device according to a fourth embodiment of the present invention.

FIG. 14 is an illustration showing a positional relationship in a planar direction between a floating gate 40, a diffusion layer 60, and a diffusion layer 70 of a nonvolatile semiconductor memory device 10 according to a fourth embodiment of the present invention. FIG. 1 is a cross-sectional view taken along the line A-A of FIG. 14.

As shown in FIG. 14, the floating gate 40 has a main region R, which corresponds to the channel width of a channel region 2080, and an extended region R', which extends on both sides of the main region R in the channel width direction.

Also, the diffusion layer 70 has a main region S, which corresponds to the channel width of the channel region 2080, and an extended region S', which extends on both sides of the main region S in the channel width direction.

The main region R of the floating gate 40 overlaps partially with the main region S of the diffusion layer 70. Also, the extended region R' of the floating gate 40 overlaps partially with the extended region S' of the diffusion layer 70 on both sides. Thus, capacitive coupling is achieved in the regions where the floating gate 40 and the diffusion layer 70 overlap each other.

According to the fourth embodiment, therefore, the partial overlapping of the extended region R' of the floating gate 40 and the extended region S' of the diffusion layer 70 increases the region where the floating gate 40 and the diffusion layer 70 overlap each other, with the result of an increased coupling capacitance. And the increased coupling capacitance can lower the voltage to be applied to the diffusion layer 70 in a write operation discussed later and the voltage to be applied to the diffusion layer 60 in an erase operation discussed later.

It is to be noted, however, that in overlapping the diffusion layer 70 and the floating gate 40, a sufficient separation must be provided between the diffusion layer 70 and the diffusion layer 60 so as to prevent a punch-through therebetween.

The operation of the nonvolatile semiconductor memory device 10 according to the fourth embodiment is similar to that of the first embodiment.

With the above-described nonvolatile semiconductor memory device 10, the write operation, as in the first embodiment, can be effected merely by the application of a high voltage to the diffusion layer 70 in capacitive coupling with the floating gate 40 without the use of the control gate. This feature contributes to the simplification and miniaturization of the structure of the memory cell. Furthermore, in this fourth embodiment, the floating gate 40 and the diffusion layer 70 are overlapped with each other in regions in addition to the region corresponding to the channel width of the channel region 2080. Thus, the voltage to be applied to the diffusion layer 70 in a write operation and the voltage to be applied to the diffusion layer 60 in an erase operation can both be lowered.

(Fabrication Method)

Now a method for fabricating a nonvolatile semiconductor memory device 10 will be described with reference to FIGS. 3 to 5 and FIG. 15. The nonvolatile semiconductor memory device 10 according to the fourth embodiment can be fabricated by the method similar to that described in the first embodiment. And the fabrication of the nonvolatile semiconductor memory device 10 can be carried out in parallel with the fabrication of the MOSFET.

The fabrication of the nonvolatile semiconductor memory device 10 according to the fourth embodiment is carried out by the processes as represented in FIGS. 3A to 3D, FIGS. 4A to 4D, and FIG. 5.

Figure 15:
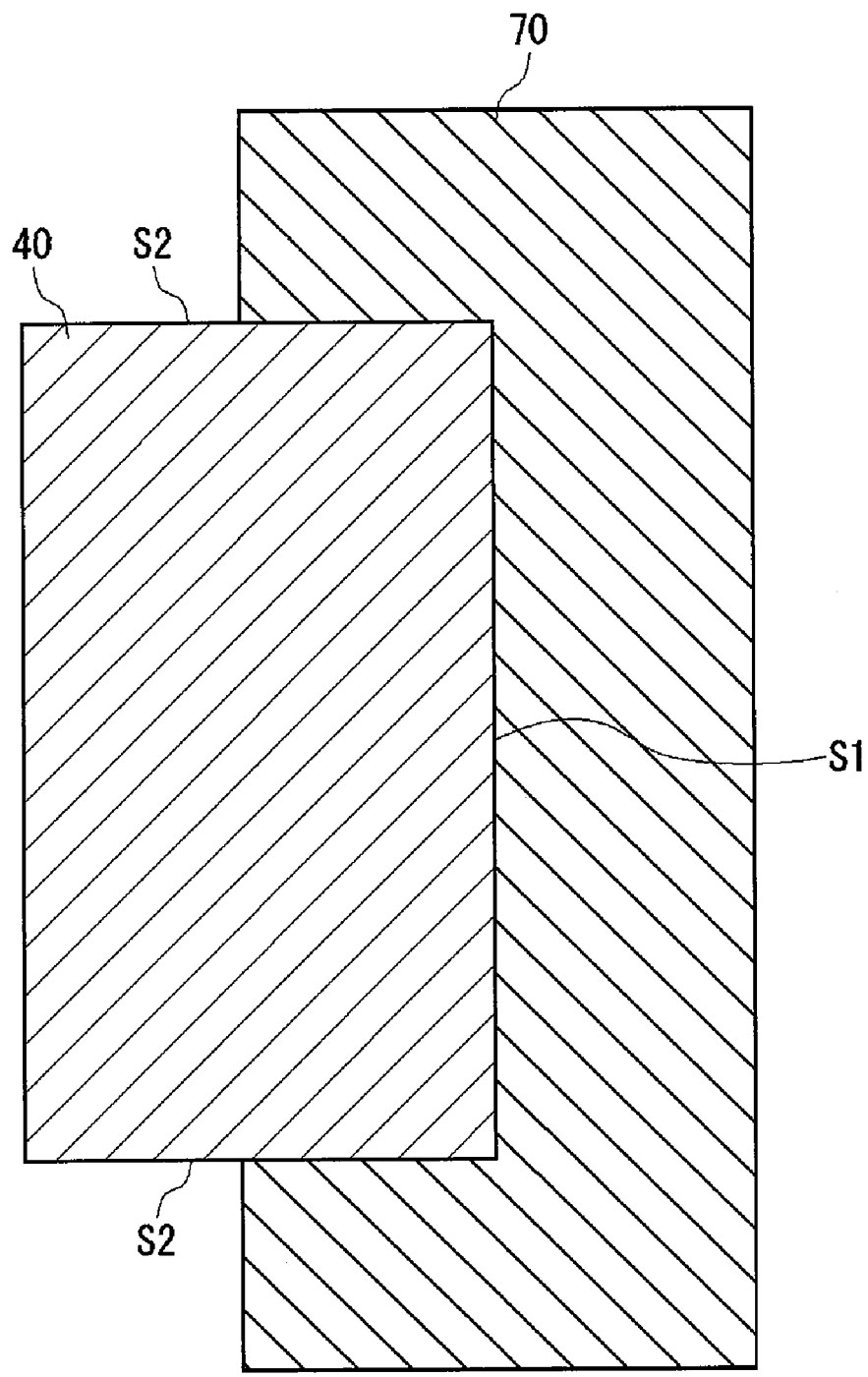
FIG. 15 is an illustration showing a positional relationship between a diffusion layer (second impurity diffusion layer), which an n type impurity ion is injected into, and a floating gate.

In the fourth embodiment, as shown in FIG. 15, the mask is provided with an opening such that the region of the diffusion layer 70 where an n-type impurity is ion-injected is in contact not only with one side S1 of the floating gate 40 but also with the sides S2 thereof in the gate width direction.

Through the above-described processes, the nonvolatile semiconductor memory device 10 and the MOSFET 90 according to the fourth embodiment are fabricated. The fabrication process of the nonvolatile semiconductor memory device 10 is highly compatible with that of the MOSFET 90, so that they can be produced in parallel with each other. This results in the reduction in the number of processes and simplification of the whole manufacturing process.

Fifth Embodiment

Figure 16:
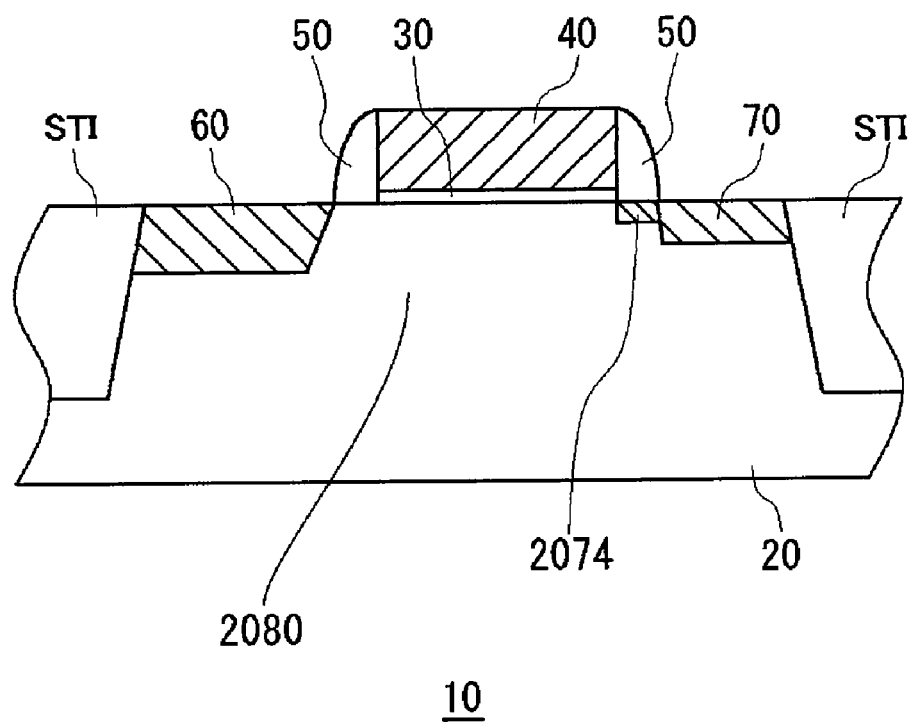
FIG. 16 is a cross-sectional view showing a structure of a nonvolatile semiconductor memory device according to a fifth embodiment of the present invention.
Figure 17:
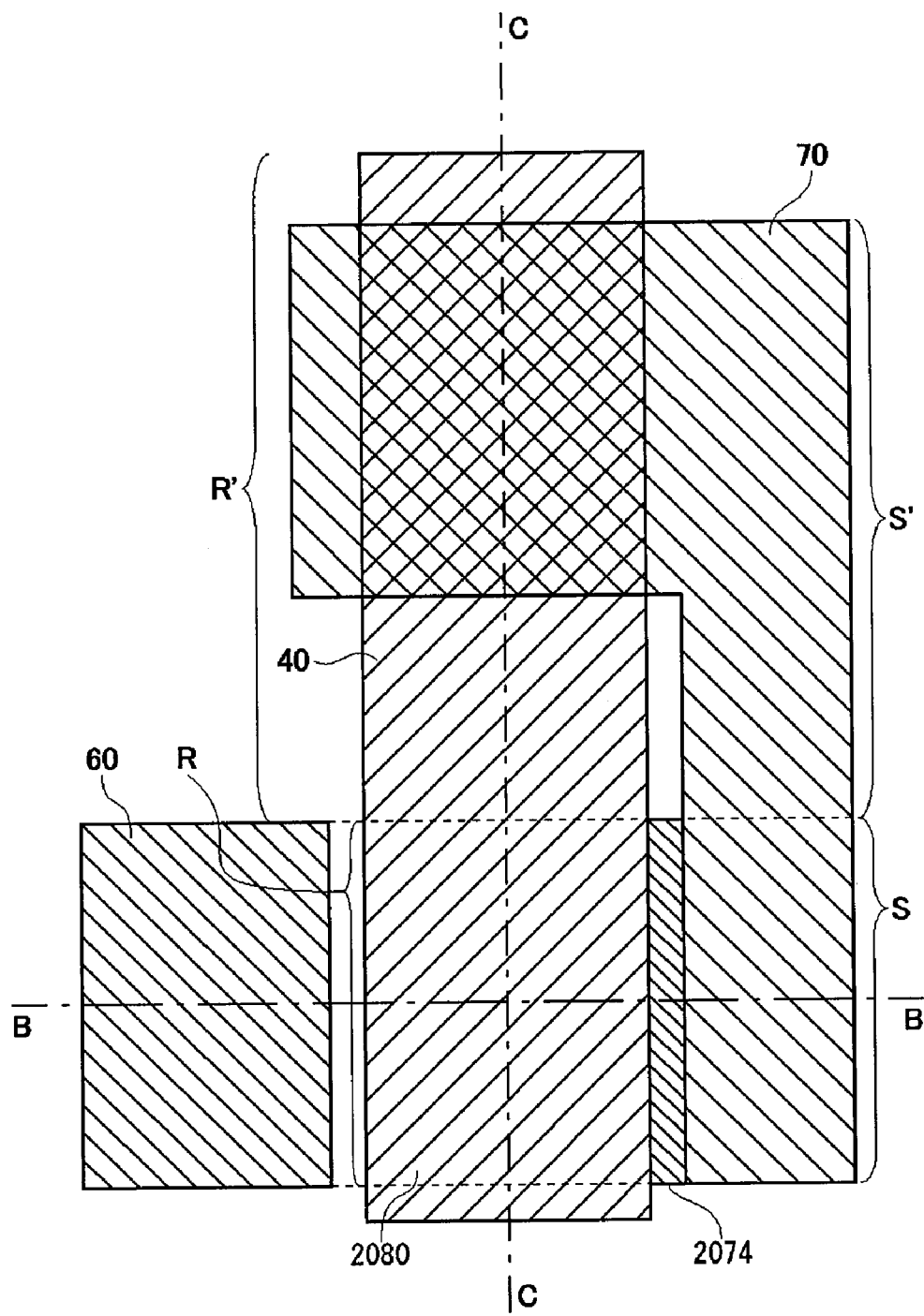
FIG. 17 is an illustration showing a positional relationship in a planar direction among a floating gate, a first impurity diffusion layer and a second impurity diffusion layer of a nonvolatile semiconductor memory device according to a fifth embodiment of the present invention.

FIG. 16 is a cross-sectional view showing a structure of a nonvolatile semiconductor memory device 10 according to a fifth embodiment of the present invention. FIG. 17 is an illustration showing a positional relationship in the planar direction among a floating gate 40, a diffusion layer 60 and a diffusion layer 70 of the nonvolatile semiconductor memory device 10 according to the fifth embodiment. FIG. 16 is a cross-sectional view taken along the line B-B of FIG. 17.

As shown in FIG. 16, in the fifth embodiment, an extension layer 2074, which is an n+ type diffusion layer, is provided below the side-wall insulating film 50 and within the semiconductor substrate 20.

As shown in FIG. 17, the floating gate 40 has a main region R, which corresponds to the channel width of a channel region 2080 and an extended region R', which extends on one side of the main region R in the channel width direction.

As shown in FIG. 17, the diffusion layer 70 has a main region S and an extended region S'. The diffusion layer 70 is connected to the extension layer 2074 in the main region S. The extended region S' of the diffusion layer 70 is so extended as to intersect with the extended region R' of the floating gate 40. In this fifth embodiment, the extended region S' is bent at a right angle in the middle and therefore the extended region S' intersects with the extended region R' of the floating gate 40.

Thus, a structure is obtained where the extended region R' of the floating gate 40 overlaps partially with the extended region S' of the diffusion layer 70. As a result, capacitive coupling is achieved in a region where the floating gate 40 overlaps with the diffusion layer 70. Enlarging an area where the floating gate 40 and the diffusion layer 70 overlap with each other allows the coupling capacity to increase.

The write, erase and read operations in the nonvolatile semiconductor memory device 10 according to the fifth embodiment are similar to those of the fourth embodiment. However, the fifth embodiment differs from the fourth embodiment in that the capacitive coupling between the floating gate 40 and the diffusion layer 70 is achieved in a region separated apart from the channel region.

(Fabrication Method)

Now a method for fabricating a nonvolatile semiconductor memory device 10 according to the fifth embodiment will be described with reference to FIGS. 18 to 20. The fabrication of the nonvolatile semiconductor memory device 10 can be carried out in parallel with the fabrication of a depression-type MOSFET as will be discussed later.

First, as shown in FIGS. 18A(i) and 18A(ii), a semiconductor substrate 1020 is prepared which is a P-type silicon substrate with the elements isolated from one another by a silicon oxide film 22, which is formed by a known technique such as STI. Note that the left halves of (i) in FIGS. 18A to 18D, FIGS. 19A to 19C and FIG. 20 are cross-sectional views of a depression-type MOSFET, and the right halves thereof are cross-sectional views taken along the line B-B of FIG. 17. Also, in FIGS. 18A to 18D, FIGS. 19A to 19C and FIG. 20, (ii) are cross-sectional views taken along the line C-C of FIG. 17.

Next, as shown in FIGS. 18B(i) and 18B(ii), the diffusion layer 70 is formed by injecting As ions into parts of a memory cell forming region M with the elements isolated from one another by a silicon oxide film 22, by using a mask (not shown) having openings for the parts thereof. At the same time, a depression layer 2110 is formed by injecting As ions into a MOS forming region N including the channel region. Note that the diffusion layer 70 has a main region S and an L-shaped extended region S' extending from the main region S as shown in FIG. 17.

Next, as shown in FIGS. 18C(i) and 18C(ii), the gate insulator 30 made of silicon oxide is formed by a thermal oxidation method on the surface layer of the semiconductor substrate 20.

Next, as shown in FIGS. 18D(i) and 18D(ii), a polysilicon film 32 is formed on the gate insulator 30.

Then, as shown in FIGS. 19A(i) and 19A(ii), a floating gate 40 and a gate electrode 100 are formed by selectively removing predetermined regions of the polysilicon film 32 by photolithography and dry etching methods. The floating gate 40 thus formed has a main region R and an extended region R' as shown in FIG. 17, and the extended region R' of the floating gate 40 crosses over the extended region S' of the diffusion layer 70. That is, part of the extended region R' of the floating gate 1040 overlaps part the extended region S' of the diffusion layer 70. While it is preferable that the main region R of the floating gate 40 is close to the main region S of the diffusion layer 70 with a predetermined distance apart therefrom, the arrangement may be such that the main region R of the floating gate 40 and the main region S of the diffusion layer 70 are next to each other without separation.

Next, as shown in FIGS. 19B(i) and 19B(ii), after removing the exposed part of the gate insulator 30 by etching, arsenic (As) is shallowly injected into the extension layer 2074 between one of the side walls of the floating gate 40 (opposite side of the gate electrode 2100 in this fifth embodiment) and the main region S of the diffusion layer 70, and the source region 104 and the drain region 2106 on their respective sides of the gate electrode 100 by using a mask (not shown) having the openings. As a result, the main region S of the diffusion layer 70 is in close proximity to the main region R of the floating gate 40 self-aligningly with a medium of the extension layer 2074 in between.

Next, a silicon oxide film (not shown) is deposited on the whole top surface of the semiconductor substrate 2020. Then, as shown in FIGS. 19C(i) and 19C(ii), the silicon oxide film is etched back by anisotropic dry etching to leave the silicon oxide film on each side only of the floating gate 40 and the gate electrode 100. As a result, side-wall insulating films 50 and 102 are formed as side walls of the floating gate 40 and the gate electrode 100, respectively. Note that one of the side-wall insulating films 50 is formed on top of the extension layer 2074.

Figure 20:
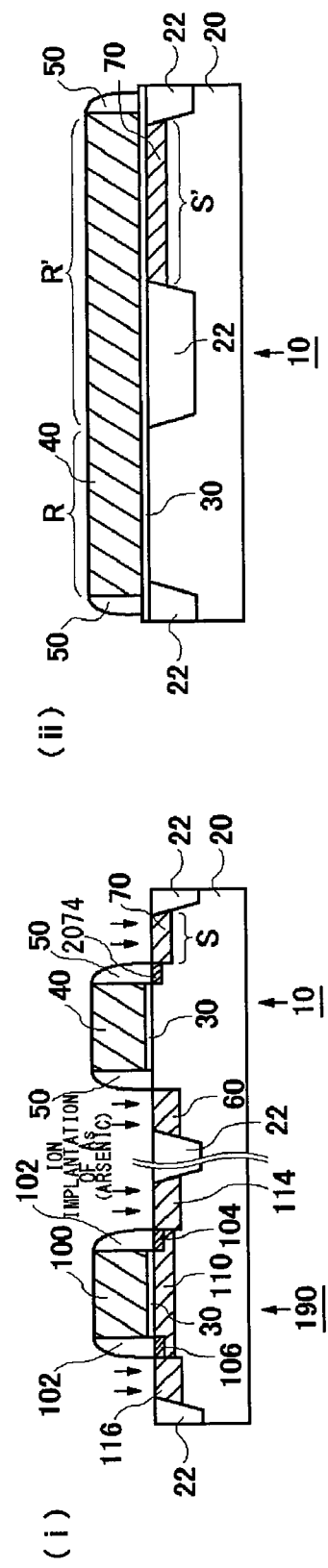

Then, as shown in FIGS. 20(i) and 20(ii), As ions are injected into the top surface of the semiconductor substrate 20. As a result, the diffusion layer 60 is doped with As in self-alignment with the side-wall insulating films 50. Also, the source region 114 and the drain region 116 are formed in self-alignment with the side-wall insulating films 102. Note also that the source region 104 and the drain region 106 become the extension layers of the source region 114 and the drain region 116, respectively.

Through the above-described processes, the nonvolatile semiconductor memory device 10 and the depression-type MOSFET 190 are fabricated in parallel with each other. As described above, the ion injection into the channel region of the depression-type MOSFET 190 and the ion injection into the diffusion layer 70 can be carried out in the same process. This simplifies the manufacturing process of semiconductor integrated circuits where both logic circuitry and nonvolatile semiconductor memory devices are combined and thus reduces the manufacturing costs.

In the manufacturing method according to this fifth embodiment, part of the extended region R' of the floating gate 40 overlaps part of the extended region S' of the diffusion layer 70 in a region apart from the channel region. Hence, the nonvolatile semiconductor memory device 10 can be formed by the ion injection process without having to undergo any thermal diffusion process. Also, the fourth embodiment and the fifth embodiment may be combined and the arrangement may be such that while the floating gate 40 and the diffusion layer 70 are overlapped with each other in the channel region, the floating gate 40 and the diffusion layer 70 are also overlapped with each other in the region apart from the channel region as described above.

Sixth Embodiment

Figure 21:
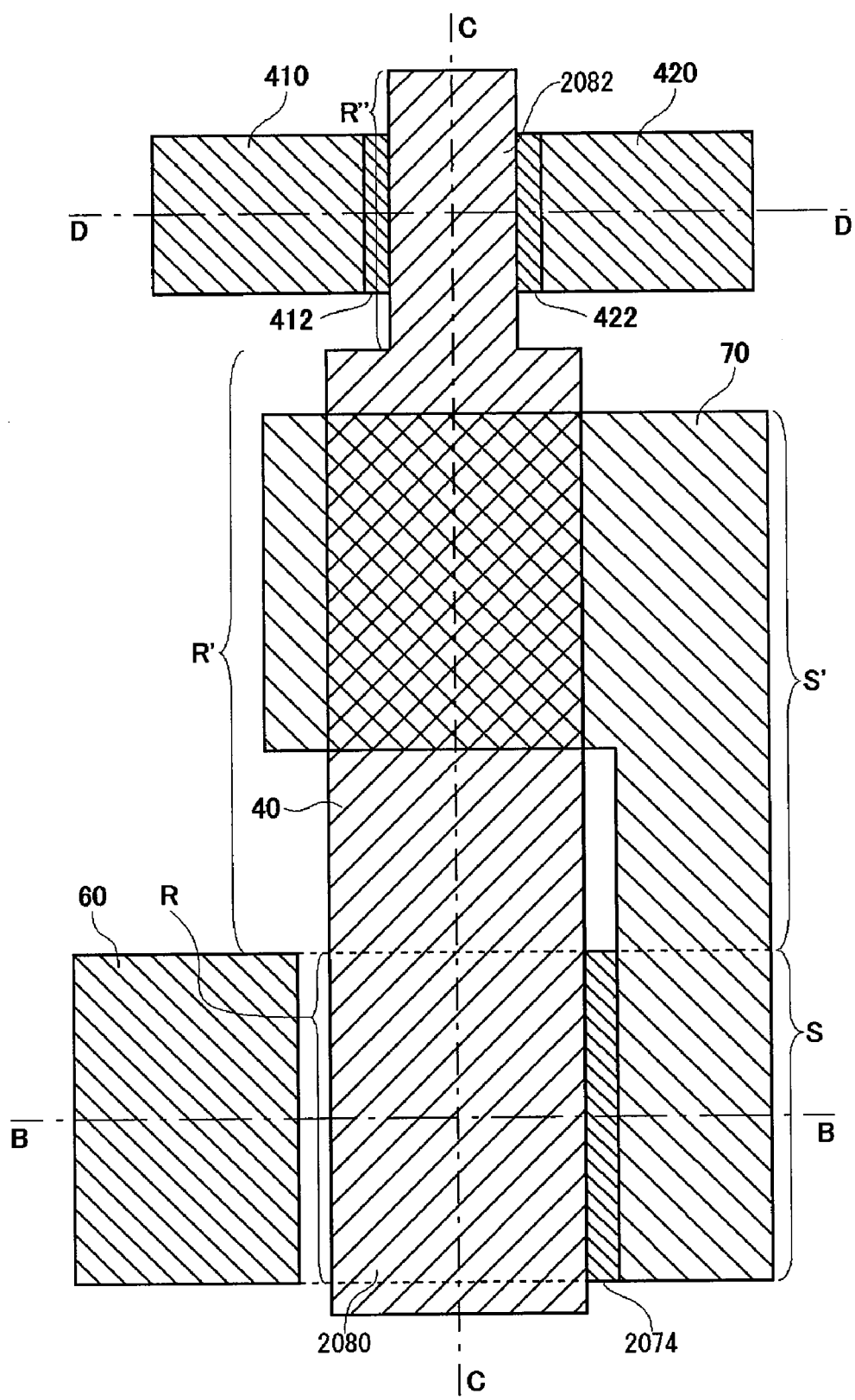
FIG. 21 is a plan view showing a positional relationship between a floating gate and diffusion layers of a nonvolatile semiconductor memory device according to a sixth embodiment of the present invention.
Figure 22:
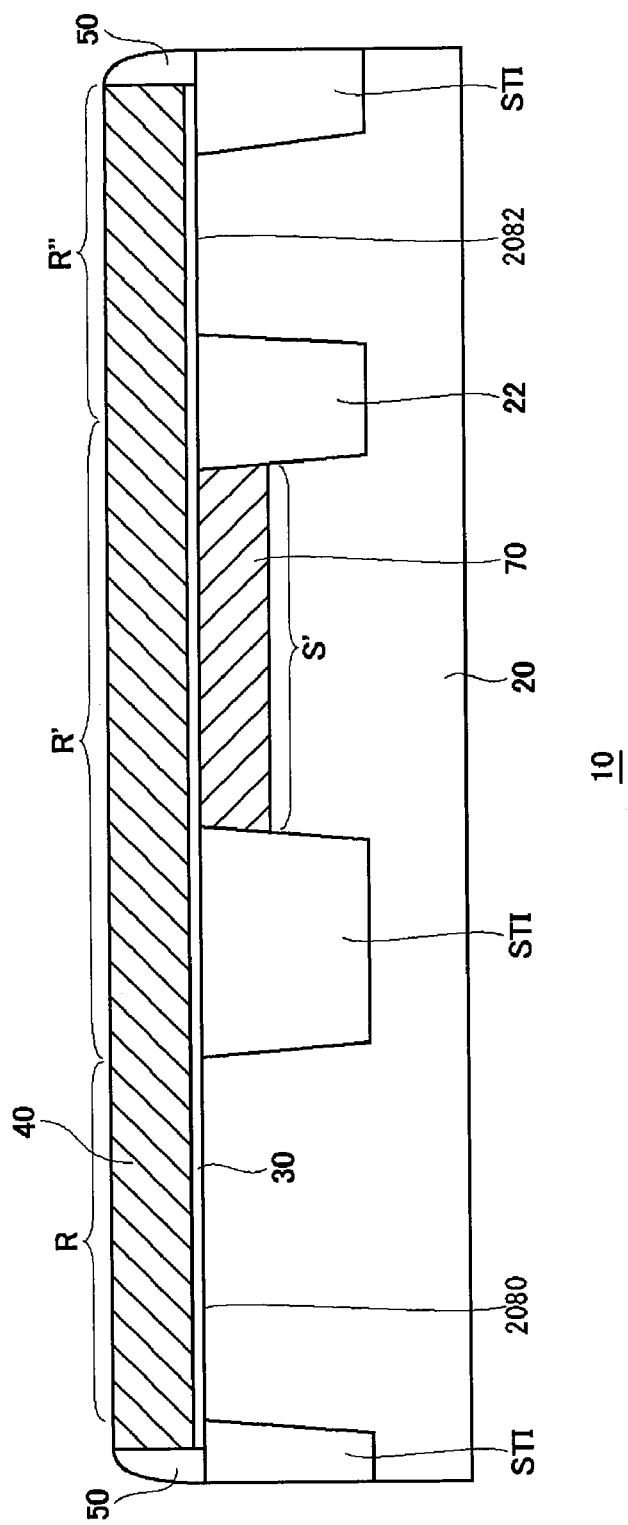
FIG. 22 is a cross-sectional view taken along the line C-C of FIG. 21.
Figure 23:
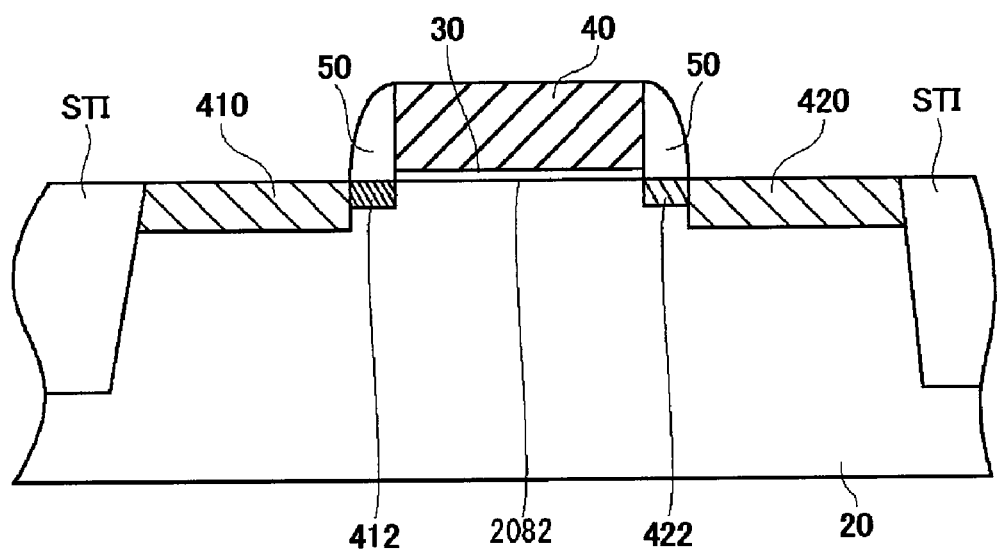
FIG. 23 is a cross-sectional view taken along the line D-D of FIG. 21.

FIG. 21 is a plan view showing a positional relationship between a floating gate and diffusion layers of a nonvolatile semiconductor memory device according to a sixth embodiment of the present invention. FIG. 22 is a cross-sectional view taken along the line C-C of FIG. 21, and FIG. 23 is a cross-sectional view taken along the line D-D of FIG. 21. The cross-sectional view taken along the line B-B of FIG. 21 is similar to that of FIG. 16.

The structure of the nonvolatile semiconductor memory device 10 according to the sixth embodiment is such that a write-and-erase transistor and a read transistor are combined. More specifically, in each memory cell the gate of a read transistor shares the same node as the floating gate of a write-and-erase transistor, and a write-and-erase operation and a read operation are performed by different transistors.

As shown in FIG. 21, the sixth embodiment is similar to the fifth embodiment in that the floating gate 40 has the main region R corresponding to the channel width of the channel region 2080 and the extended region R', which extends on one side of the main region R in the channel width direction. The sixth embodiment differs from the fifth embodiment in that the floating gate 40 according to the sixth embodiment has an extended region R" which extends from the extended region R' and overlaps with a channel region 2082 of the read transistor.

Across the extended region R" of the floating gate 40, a diffusion layer 410, which is a fourth impurity region (drain region), and an extension layer 412 are provided on one side of the extended region R", whereas a diffusion layer 420, which is a fifth impurity diffusion region (source region) and an extension layer 422 are provided on the other side thereof. The extension layers 412 and 422 are formed below the respective side-wall insulating films 50 provided on the side walls of the extended region R" of the floating gate 40.

The write operation and the erase operation in the nonvolatile semiconductor memory device 10 according to the sixth embodiment are similar to those in the fourth embodiment. That is, the diffusion layer 60 is set for a low voltage and the diffusion layer 70 is set for a high voltage in a write operation, and thereby the hot electrons are injected into the floating gate 40 in capacitive coupling with the diffusion layer 70.

In an erase operation, on the other hand, the diffusion layer 60 is set for a high voltage and the diffusion layer 70 is set for a low voltage. As a result, the electrons accumulated in the floating gate 40 are released.

Similar to the fifth embodiment, in this sixth embodiment, capacitive coupling is achieved between the extended region R' of the floating gate 40 and the extended region S' of the diffusion layer 70. Thus, it is possible to reduce the voltage to be applied to the diffusion layer 70 in a write operation and the voltage to be applied to the diffusion layer 60 in an erase operation.

In a read operation, differently from the fifth embodiment, a voltage (e.g., 5 V) is applied to the diffusion layer 410 and a low voltage (e.g., 0 V) is applied to the diffusion layer 420. At this time, if the memory cell is in an erased state, a current will flow between the diffusion layer 410 and the diffusion layer 420. On the other hand, if the memory cell is in a written state, no current will flow between the diffusion layer 410 and the diffusion layer 420. Thus, information stored in the floating gate 1040 is read out according to this current.

As described above, in each memory cell, a write-and-erase operation and a read operation are performed by different transistors, so that the possibility of ejecting the electric charge accumulated in the floating gate 40 can be suppressed by the voltage applied to the drain in an read operation. Particularly in this sixth embodiment, the voltage applied to the diffusion layer 70 in a write operation and the voltage applied to the diffusion layer 60 in an erase operation are reduced. Hence, it is extremely important to enhance the reliability of the memory cell by suppressing the adverse effect in a read operation.

Considering the punch-through and the like phenomenon, the gate length needs to be longer to a certain degree in the write-and-erase transistor. In this respect, the write-and-erase transistor and the read transistor are provided separately in the sixth embodiment, so that the gate length of the read transistor can be made shorter than that of the write-and-erase transistor. This allows the drive capacity of the read transistor to increases, thus realizing a high-speed memory cell.

EXAMPLE 1

Nonvolatile Memory Array

FIGS. 24A to 24C are each a circuit diagram of a nonvolatile semiconductor memory device arranged in a matrix, namely a nonvolatile memory array (Example 1). The diffusion layer 70 of the nonvolatile semiconductor memory device 10 is connected to a drain of a MOSFET 190. The diffusion layers 60 of the nonvolatile semiconductor memory device 10 which are disposed adjacent to each other along a write bit line 2210 are connected to a common drain line (erase line). A source of the MOSFET 190 is connected to a write bit line 2210, whereas a gate electrode of the MOSFET 190 is a word line 2220. Note that the nonvolatile memory array according to Example 1 is an example where the nonvolatile semiconductor memory device according to the sixth embodiment is used as the nonvolatile semiconductor memory device arranged in a matrix.

The floating gate 40 of the nonvolatile semiconductor memory device 10 also functions as a gate of a read transistor 400. A diffusion layer 420 which is a source of the read transistor 400 is grounded. A diffusion layer 410 which is a drain of the read transistor 400 is connected to a source of a MOSFET 500. A drain of the MOSFET 500 is connected to a read bit line 2230. A gate electrode of the MOSFET 500 is connected to the word line 2220, which is commonly used by the MOSFET 190 and the MOSFET 500.

In the following description, a write bit line 2210 related to a cell 2300 of interest that writes data and the like will be called a write bit line 2210a, and a write bit line 2210 not related thereto will be called a write bit line 2210b. Also, a word line 2220 related to the cell 2300 of interest will be called a word line 2220a, whereas a word line 2220 not related thereto will be called a word line 2220b.

For a write operation of the cell 300 of interest, the write bit line 2210a is set to 6 V and the write bit line 2210b is set to an open state as shown in FIG. 24A. Also, the word line 2220a is set to 6 V, and the word line 2220b to 0 V. Also, the drain line 2200 is set to 0 V. Then the MOSFET 190 in the cell 2300 of interest turns on, and the diffusion layer 70 of the nonvolatile semiconductor memory device 10 is set to 6 V. On the other hand, the diffusion layer 60 of the nonvolatile semiconductor memory device 10 is set to 0 V. As a result, a state of write operation illustrated in FIG. 2A of the nonvolatile semiconductor memory device 10 is created, with electrons being injected into the floating gate of the nonvolatile semiconductor memory device 10 of the cell 300 of interest.

As for the cells other than the cell 300 of interest, the injection of electrons into the floating gate does not occur because the MOSFET 190 turns off or there is not sufficient potential difference between the diffusion layer 60 and the diffusion layer 70.

For an erase operation, the write bit line 2210a and the write bit line 2210b are set to 0 V as shown in FIG. 24B. Also, the word line 2220 is set to 2 to 6 V. Also, a drain line 2200 is set to 10 V. Then the MOSFET 190 turns on, and a voltage of 10 V is applied to the diffusion layer 60 of the nonvolatile semiconductor memory device 10. On the other hand, the diffusion layer 70 of the nonvolatile semiconductor memory device 10 is set to 0 V. As a result, a state of erase operation illustrated in FIG. 2B of the nonvolatile semiconductor memory device 10 is created, with electrons being ejected from the floating gate of the nonvolatile semiconductor memory device 10. As described above, in this example, the erasure of a plurality of nonvolatile semiconductor memory devices 10 can be done at once, so that the erase operation can be done at high speed.

For a read operation of the cell 300 of interest, the write bit line 2210 is set to an open state and the word lines 2220a and 2220b are set to 5 V and 0 V, respectively, as shown in FIG. 24C. Also, the drain line 2200 is set to an open state. Then the MOSFET 500 in the cell 300 of cell turns on, and the transistor 400 is connected to the read bit line 2230. Thus, a current flows to the transistor 400 and the MOSFET 500 when there is not a sufficient accumulation of electrons in the floating gate 40. On the other hand, no current flows to the transistor 400 and the MOSFET 500 when there is a sufficient accumulation of electrons in the floating gate 40 of the nonvolatile semiconductor memory device 10 of the cell 300 of interest. Information stored in the cell 300 of interest can be read out by detecting this current using a sense amplifier connected to the read bit line 2230. Note that no current flows to the other cells on the read bit line 2230 irrespective of whether there are electrons accumulated in the floating gate or not because the MOSFET 500 is in an off state.

Thus, the arrangement of the nonvolatile semiconductor memory device (the nonvolatile memory array) according to Example 1 as described above enables the write and read operations of the cell of interest only and also achieves the simultaneous erasure of data contents stored in a plurality of cells.

EXAMPLE 2

Nonvolatile Memory Array

FIGS. 25A to 25C are each a circuit diagram of a nonvolatile memory array (Example 2). This memory array of Example 2 differs from the memory array of Example 1 in that a word line is divided into two word lines of a write word line and a read word line.

More specifically, a write word line 2221 is connected to the gate electrode of the MOSFET 190. A read word line 2222 is connected to the gate electrode of the MOSFET 500.

For a write operation, write word lines 2221*a* and 2221*b* are set to 6 V and 0 V, respectively, and the voltage of the read word line 2222 is set to 0 V as shown in FIG. 25A.

For an erase operation, the voltage of the write word line 2221 is set to 5 V and the read word line 2222 is set to 0 V as shown in FIG. 25B.

For a read operation, the voltage of the write word line 2221 is set to 0 V and read word lines 2222*a* and 2222*b* are set to 5 V and 0 V, respectively, as shown in FIG. 25C.

Thus, similar to Example 1, the arrangement of the nonvolatile memory array according to Example 2 as described above enables the write and read operations of the cell of interest only and also achieves the simultaneous erasure of data contents stored in a plurality of cells. Further, since the word line is divided into the two word lines of a write word line and a read wired line, the load of the word line can be reduced.

EXAMPLE 3

Nonvolatile Memory Array

FIGS. 26A to 26C are each a circuit diagram of a nonvolatile memory array (Example 3). This memory array of Example 3 differs from the memory array of Example 1 in that the write MOSFET 190 has an additional function of the read MOSFET 500 as shown in FIGS. 24A to 24C.

More specifically, the read MOSFET 500 as shown in FIGS. 24A to 24C is omitted and the source-side diffusion layer 420 of the transistor 400 is connected to the drain of the MOSFET 190.

The voltage applied to each line at the time of a write operation and a read operation is similar to that applied in Example 1 (see FIG. 26A and FIG. 26B). For a read operation, the voltage of the write bit line 2210*a* is set to 0 V and the voltage of the write bit line 2210*b* is set to an open state or 0 V.

Thus, similar to Example 1, the arrangement of the nonvolatile memory array according to Example 3 as described above enables the write, erase and read operations of the cell of interest only and also achieves the simplification of the circuit configuration.

The present invention is not limited to the above-described embodiments and examples only, and those resulting from any combination of them or substitution as appropriate are also within the scope of the present invention. Also, it is understood that various modifications such as changes in design made based on the knowledge of those skilled in the art is possible, and the embodiments and examples added with such modifications are also within the scope of the present invention.

In the above embodiments and examples, the write operation and the erase operation can be executed repeatedly. However, this should not be considered as limiting and, for example, the initial state is set to an erased state through ultraviolet irradiation or the like and a write operation only is available. As a result, the circuit configuration can be simplified. Such a memory device may function as an OTPROM (One-Time PROM).

The read transistor as described in the sixth embodiment may be applied to the nonvolatile semiconductor memory device according to each of the first to fifth embodiments. Thus, a structure may be realized where a write-and-erase transistor and a read transistor are combined.

More specifically, a practical application to the first embodiment is as follows. That is, the floating gate 40 as shown in FIG. 1 is overlapped with the channel region 2082 of the read transistor as shown in FIG. 21, so that a read operation can be executed by a transistor different from the nonvolatile semiconductor memory device as shown in FIG. 1.

A practical application to the second and the third embodiment is as follows. The extended region R' of the floating gate 1040 as shown in FIG. 7 is further overlapped with the channel region 2082 of the read transistor as shown in FIG. 21, so that a read operation can be executed by a transistor different from the nonvolatile semiconductor memory device as shown in FIG. 7.

A practical application to the fourth and the fifth embodiment is as follows. The extended region R' of the floating gate 40 as shown in FIGS. 14 and 17 is further overlapped with the channel region 2082 of the read transistor as shown in FIG. 21, so that a read operation can be executed by a transistor different from the nonvolatile semiconductor memory device as shown in FIGS. 14 and 17.

What is claimed is:

1. A nonvolatile semiconductor memory device, comprising:
    a semiconductor substrate of a first conductivity type;
    a gate insulator provided on said semiconductor substrate;
    a floating gate provided on said gate insulator;
    a first impurity diffusion layer, provided in a region within said semiconductor substrate, of a second conductivity type which is opposite to the first conductive type, no part of said region of the first impurity diffusion layer being under said floating gate; and
    a second impurity diffusion layer, provided within said semiconductor substrate, of the second conductivity type, which overlaps with said floating gate.

2. A nonvolatile semiconductor memory device according to claim 1, wherein by applying a high voltage to said second impurity diffusion layer at the time of a write operation,
    said second impurity diffusion layer and said floating gate are coupled together and electrons ejected from said first impurity diffusion layer are injected into said floating gate.

3. A nonvolatile semiconductor memory device according to claim 1, wherein electrons accumulated in said floating gate are ejected by applying a high voltage to said first impurity diffusion layer at the time of an erase operation.

4. A nonvolatile semiconductor memory device according to claim 1, wherein a side-wall insulating film is provided on each side wall of said floating gate, and
    wherein a separation distance between said floating gate and said first impurity diffusion layer is equal to a bottom thickness of the side-wall insulating film.

5. A nonvolatile semiconductor memory device according to claim 1, further comprising:
    a fourth impurity diffusion layer of the second conductivity type;
    a fifth impurity diffusion layer, of the second conductivity type, which is provided separately apart from said fourth impurity diffusion layer; and
    another channel provided between said fourth impurity diffusion layer and said fifth impurity diffusion layer, said another channel being different from a channel region provided between said first impurity diffusion layer and said second impurity diffusion layer,
    wherein said floating gate overlaps with said another channel region.

6. A nonvolatile semiconductor memory device, comprising:
- a semiconductor substrate of a first conductivity type;
- a gate insulator provided on said semiconductor substrate;
- a floating gate provided on said gate insulator;
- a first impurity diffusion layer, provided in a region within said semiconductor substrate, of a second conductivity type which is opposite to the first conductive type, no part of said region of the first impurity diffusion layer being under said floating gate; and
- a second impurity diffusion layer, of the second conductivity type, which is provided near said floating gate within said semiconductor substrate; and
- a third impurity diffusion layer, of the second conductivity type, which is provided separately apart from a channel region provided between said first impurity diffusion layer and said second impurity diffusion layer in a planar direction of the semiconductor substrate,
- wherein said floating gate overlaps with the channel region and said third impurity diffusion layer.

7. A nonvolatile semiconductor memory device according to claim 6, wherein by applying a high voltage to said third impurity diffusion layer and applying a voltage lower than the high voltage to said second impurity diffusion layer at the time of a write operation,
- said third impurity diffusion layer is in capacitive coupling with said floating gate, and electrons ejected from said first impurity diffusion layer are injected into said floating gate.

8. A nonvolatile semiconductor memory device according to claim 6, wherein electrons accumulated in said floating gate are ejected by applying a high voltage to said first impurity diffusion layer at the time of an erase operation.

9. A nonvolatile semiconductor memory device according to claim 6, wherein when a high voltage is applied to the first impurity diffusion layer at the time of an erase operation, electrons accumulated in said floating gate are partially ejected according to a voltage applied to said third impurity diffusion layer.

10. A nonvolatile semiconductor memory device according to claim 6, wherein a side-wall insulating film is provided on each side wall of said floating gate, and
- wherein a separation distance between said floating gate and said first impurity diffusion layer is equal to a bottom thickness of the side-wall insulating film.

11. A nonvolatile semiconductor memory device according to claim 6, further comprising:
- a fourth impurity diffusion layer of the second conductivity type;
- a fifth impurity diffusion layer, of the second conductivity type, which is provided separately apart from said fourth impurity diffusion layer; and
- another channel provided between said fourth impurity diffusion layer and said fifth impurity diffusion layer,
- wherein said floating gate overlaps with said another channel region.

12. A nonvolatile semiconductor memory device, comprising:
- a semiconductor substrate of a first conductivity type;
- a gate insulator provided on said semiconductor substrate;
- a floating gate provided on said gate insulator;
- a first impurity diffusion layer, provided in a region within said semiconductor substrate, of a second conductivity type which is opposite to the first conductive type, no part of said region of the first impurity diffusion layer being under said floating gate; and
- a second impurity diffusion layer of the second conductivity type which is provided near said floating gate within said semiconductor substrate,
- wherein said floating gate has a main region corresponding to a channel width of a channel region between said first impurity diffusion layer and said second impurity diffusion layer and
- an extended region extending externally in a channel width direction of the main region, and
- wherein said second impurity diffusion layer overlaps with said floating gate in the extended region.

13. A nonvolatile semiconductor memory device according to claim 12, wherein said second impurity diffusion layer overlaps with said floating gate in the extended region in such a manner that said second impurity diffusion layer extends around at least one side of the channel region.

14. A nonvolatile semiconductor memory device according to claim 12, wherein a main region of said second impurity diffusion layer overlaps with said floating gate within said semiconductor substrate.

15. A nonvolatile semiconductor memory device according to claim 12, wherein a side-wall insulating film is provided on each side wall of said floating gate, and
- wherein a separation distance between said floating gate and said first impurity diffusion layer is equal to a bottom thickness of the side-wall insulating film.

16. A nonvolatile semiconductor memory device according to claim 12, further comprising:
- a fourth impurity diffusion layer of the second conductivity type;
- a fifth impurity diffusion, of the second conductivity type, which is provided separately apart from said fourth impurity diffusion layer; and
- another channel provided between said fourth impurity diffusion layer and said fifth impurity diffusion layer,
- wherein the extended region of said floating gate overlaps with said another channel region.

17. A nonvolatile memory array, comprising:
- a nonvolatile semiconductor memory device, according to claim 16, disposed in a matrix;
- a first transistor connected to the second impurity diffusion layer of said nonvolatile semiconductor memory device;
- a second transistor connected to the fourth impurity diffusion layer;
- an erase line connected commonly to the first impurity diffusion layers of said nonvolatile semiconductor memory device;
- a word line connected commonly to a gate electrode of said first transistor and a gate electrode of said second transistor;
- a write bit line connected commonly to drains of said first transistor; and
- a read bit line connected commonly to drains of said second transistor.

18. A nonvolatile memory array, comprising:
- a nonvolatile semiconductor memory device, according to claim 16, disposed in a matrix;
- a first transistor connected to the second impurity diffusion layer of said nonvolatile semiconductor memory device;
- a second transistor connected to the fourth impurity diffusion layer;
- an erase line connected commonly to the first impurity diffusion layers of said nonvolatile semiconductor memory device;
- a write word line connected to a gate electrode of said first transistor;

a read word line connected to a gate electrode of said second transistor;
a write bit line connected commonly to drains of said first transistor; and
a read bit line connected commonly to drains of said second transistor.

19. A nonvolatile memory array, comprising:
a nonvolatile semiconductor memory device, according to claim 16, disposed in a matrix;
a first transistor connected to the second impurity diffusion layer of said nonvolatile semiconductor memory device;
an erase line connected commonly to the first impurity diffusion layers of said nonvolatile semiconductor memory device;
a write word line connected to a gate electrode of said first transistor;
a write bit line connected commonly to drains of said first transistor; and
a read bit line connected commonly to the fourth impurity diffusion layers.

* * * * *